United States Patent
Jeon et al.

(10) Patent No.: US 9,053,964 B2
(45) Date of Patent: Jun. 9, 2015

(54) SEMICONDUCTOR DEVICES INCLUDING A FIRST AND SECOND HFET AND METHODS OF MANUFACTURING THE SAME

(71) Applicant: Samsung Electronics Co., Ltd., Suwon-Si, Gyeonggi-Do (KR)

(72) Inventors: Woo-chul Jeon, Daegu (KR); Woong-je Sung, Hwaseong-si (KR); Jai-kwang Shin, Anyang-si (KR); Jae-joon Oh, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 13/922,395

(22) Filed: Jun. 20, 2013

(65) Prior Publication Data

US 2014/0091366 A1    Apr. 3, 2014

(30) Foreign Application Priority Data

Sep. 28, 2012  (KR) .................. 10-2012-0109275

(51) Int. Cl.
*H01L 31/0328*    (2006.01)
*H01L 27/088*    (2006.01)
*H01L 29/66*    (2006.01)
*H01L 29/778*    (2006.01)
*H01L 21/8252*    (2006.01)
*H01L 27/06*    (2006.01)
*H01L 27/085*    (2006.01)
*H01L 29/20*    (2006.01)

(52) U.S. Cl.
CPC ...... *H01L 27/0883* (2013.01); *H01L 29/66431* (2013.01); *H01L 29/66462* (2013.01); *H01L 29/7787* (2013.01); *H01L 29/2003* (2013.01); *H01L 21/8252* (2013.01); *H01L 27/0605* (2013.01); *H01L 27/0694* (2013.01); *H01L 27/085* (2013.01)

(58) Field of Classification Search
USPC .......... 257/192, 194, 196, E27.026, E27.027, 257/E27.028, E27.029, E29.246, 195; 438/167, 172
See application file for complete search history.

(56) References Cited

U.S. PATENT DOCUMENTS

| | | | |
|---|---|---|---|
| 4,830,980 A | | 5/1989 | Hsieh |
| 5,302,840 A | | 4/1994 | Takikawa |
| 5,367,183 A | | 11/1994 | Perea et al. |
| 5,606,186 A | * | 2/1997 | Noda ............................ 257/226 |
| 5,847,419 A | * | 12/1998 | Imai et al. ..................... 257/192 |
| 6,867,078 B1 | * | 3/2005 | Green et al. .................. 438/167 |
| 7,786,511 B2 | | 8/2010 | Ishida |
| 7,816,707 B2 | | 10/2010 | Hikita et al. |
| 8,557,644 B2 | * | 10/2013 | Briere .......................... 438/167 |
| 2006/0124935 A1 | | 6/2006 | Bhattacharyya |

* cited by examiner

*Primary Examiner* — Matthew E Warren
(74) *Attorney, Agent, or Firm* — Harness, Dickey & Pierce, PLC

(57) ABSTRACT

Example embodiments relate to semiconductor devices and/or methods of manufacturing the same. According to example embodiments, a semiconductor device may include a first heterojunction field effect transistor (HFET) on a first surface of a substrate, and a second HFET. A second surface of the substrate may be on the second HFET. The second HFET may have different properties (characteristics) than the first HFET. One of the first and second HFETs may be of an n type, while the other thereof may be of a p type. The first and second HFETs may be high-electron-mobility transistors (HEMTs). One of the first and second HFETs may have normally-on properties, while the other thereof may have normally-off properties.

25 Claims, 19 Drawing Sheets

SEMICONDUCTOR DEVICES INCLUDING A FIRST AND SECOND HFET AND METHODS OF MANUFACTURING THE SAME

CROSS-REFERENCE TO RELATED APPLICATIONS

This application claims priority under 35 U.S.C. §119 to Korean Patent Application No. 10-2012-0109275, filed on Sep. 28, 2012, in the Korean Intellectual Property Office, the disclosure of which is incorporated herein in its entirety by reference.

BACKGROUND

1. Field

Example embodiments relate to semiconductor devices and/or methods of manufacturing the same, and more particularly, to semiconductor devices including transistors and/or methods of manufacturing the same.

2. Description of the Related Art

A heterojunction field effect transistor (HFET) is a transistor that includes a heterojunction structure between compound semiconductors. Since high-density charges may concentrate on a heterojunction interface of the HFET, charge mobility may increase. Due to the physical properties of the HFET, the HFET may be used in various devices such as high-power devices. In particular, a gallium nitride (GaN)-based HFET has attracted much attention as a device capable of replacing a silicon (Si)-based power device.

Presently, HFETs may be manufactured using an epitaxial growth process on a sapphire substrate or a silicon substrate. In general, HFETs may be n-type devices having normally-on properties. In this regard, it may be difficult to manufacture devices having various structures using HFETs. Thus, to increase the practicability and applicability of HFETs, techniques and methods of easily manufacturing devices having various structures using HFETs are desired.

SUMMARY

Example embodiments relate to techniques and/or methods of increasing the practicability and applicability of heterojunction field effect transistors (HFETs).

Example embodiments also relate to techniques and methods of embodying devices having various constructions using HFETs.

Example embodiments relate to semiconductor devices including HFETs formed on both surfaces of a substrate and/or methods of manufacturing the same.

Additional aspects will be set forth in part in the description which follows and, in part, will be apparent from the description, or may be learned by practice of example embodiments.

According to example embodiments, a semiconductor device includes a first heterojunction field effect transistor (HFET); a second HFET having different properties than the first HFET; and a substrate. The substrate has a first surface that is opposite a second surface. The first HFET is on the first surface of the substrate. The second surface of the substrate is on the second HFET.

In example embodiments, the first HFET and the second HFET may be electrically connected to each other.

In example embodiments, one of the first and second HFETs may include a 2-dimensional electron gas (2DEG), and an other thereof may include a 2-dimensional hole gas (2DHG).

In example embodiments, the first HFET may be an n-type HFET, and the second HFET may be a p-type HFET.

In example embodiments, a gate of the first HFET may be connected to a gate of the second HFET, and a drain of the first HFET may be connected to a source of the second HFET.

In example embodiments, a gate of the first HFET may be connected to a gate of the second HFET, a source of the first HFET may be connected to a source of the second HFET, and a drain of the first HFET may be connected to a drain of the second HFET.

In example embodiments, each of the first HFET and the second HFET may be a high-electron-mobility transistor (HEMT).

In example embodiments, the first HFET may be a normally-on HEMT, and the second HFET may be a normally-off HEMT.

In example embodiments, the first HFET and the second HFET may be connected in a cascode configuration.

In example embodiments, a source of the first HFET may be connected to a drain of the second HFET.

In example embodiments, a gate of the first HFET may be connected to a source of the second HFET.

In example embodiments, at least a portion of the first HFET and at least a portion of the second HFET may be connected to each other through the substrate by at least one conductive plug.

In example embodiments, at least a portion of the first HFET and at least a portion of the second HFET may be connected to each other by at least one bonding wire.

In example embodiments, a portion of the first HFET and a portion of the second HFET may be connected to each other through the substrate by at least one conductive plug, and an other portion of the first HFET and an other portion of the second HFET may be connected to each other by at least one bonding wire.

In example embodiments, at least one of the first HFET and the second HFET may include a gallium nitride (GaN)-based material.

In example embodiments, the substrate may be one of a single substrate and a multi-substrate structure.

In example embodiments, the substrate may include a first substrate and a second substrate, the second substrate being adhered to the first substrate. A bottom surface of the first substrate may be on one of the first HFET and the second HFET, and an other of the first HFET and the second HFET may be on a top surface of the second substrate.

According to example embodiments, a power device includes the above-described semiconductor device.

According to example embodiments, an inverter includes the above-described semiconductor device.

According to example embodiments, a method of manufacturing a semiconductor device includes: forming a first HFET on a first surface of a substrate, and forming a second HFET on a second surface of the substrate, the second surface being opposite the first surface of the substrate, the second HFET having different properties from the first HFET.

In example embodiments, the method may further include forming a connection element for electrically connecting the first and second HFETs.

In example embodiments, the forming the connection element may include forming at least one hole through the substrate and forming a conductive plug in the hole.

In example embodiments, the forming the connection element may include forming at least one bonding wire for connecting the first and second HFETs.

In example embodiments, one of the first HFET and the second HFET may be an n-type HFET, and an other of the first HFET and the second HFET may be a p-type HFET.

In example embodiments, one of the first HFET and the second HFET may be a normally-on HEMT, and an other of the first HFET and the second HFET may be a normally-off HEMT.

According to example embodiments, a method of manufacturing a semiconductor device includes forming a first HFET on a first substrate, forming a second HFET having different properties from the first HFET on a second substrate, and adhering the second substrate to the first substrate such that the first substrate and the second substrate are between the first HFET and the second HFET.

In example embodiments, the method may further include forming a connection element for electrically connecting the first and second HFETs.

In example embodiments, the forming the connection element may include forming at least one first conductive plug through the first substrate, forming at least one second conductive plug through the second substrate, and connecting the first conductive plug with the second conductive plug.

In example embodiments, the forming the connection element may include forming at least one bonding wire to connect the first HFET and the second HFET.

In example embodiments, one of the first HFET and the second HFET may be an n-type HFET, and an other of the first HFET and the second HFET may be a p-type HFET.

In example embodiments, one of the first HFET and the second HFET may be a normally-on HEMT, and an other of the first HFET and the second HFET may be a normally-off HEMT.

BRIEF DESCRIPTION OF THE DRAWINGS

These and/or other aspects will become apparent and more readily appreciated from the following description of non-limiting embodiments, as illustrated in the accompanying drawings. The drawings are not necessarily to scale, emphasis instead being placed upon illustrating principles of example embodiments. In the drawings.

DETAILED DESCRIPTION

Figure 1:
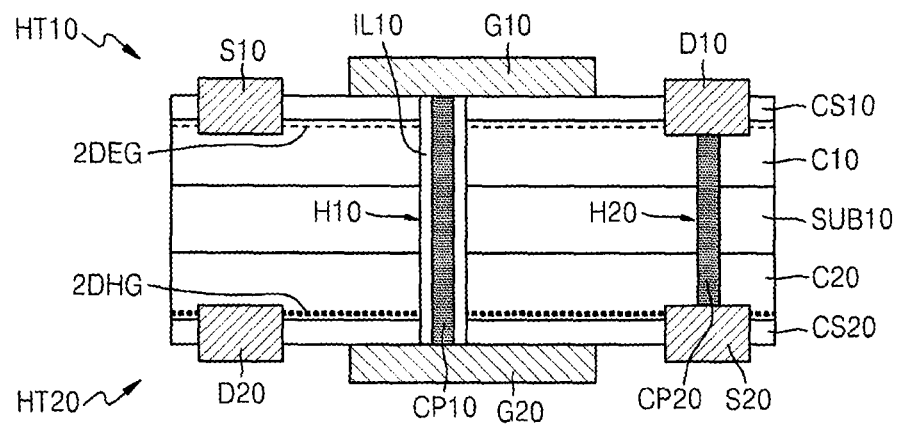
FIG. 1 is a cross-sectional view illustrating a semiconductor device according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to limit example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as being limited to the particular shapes of regions illustrated herein and are to include deviations in shapes that result, for example, from manufacturing. For example, an implanted region illustrated as a rectangle will have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, semiconductor devices and/or methods of manufacturing the same according to example embodiments will be described more fully with reference to the accompanying drawings.

FIG. 1 is a cross-sectional view of a semiconductor device according to example embodiments.

Referring to FIG. 1, a first heterojunction field effect transistor (HFET) HT10 may be disposed on a first surface (e.g., top surface) of a substrate SUB10, and a second HFET HT20 may be disposed below a second surface (e.g., bottom surface) of the substrate SUB10 that is opposite to the first surface. The substrate SUB10 may be formed of, for example, silicon (Si), sapphire, or silicon carbide (SiC). However, the substrate SUB10 is not limited thereto and may be formed of other materials. The first HFET HT10 and the second HFET HT20 may have different characteristics (properties). For instance, one of the first and second HFETs HT10 and HT20 may include a 2-dimensional electron gas (2DEG), while the other thereof may include a 2-dimensional hole gas (2DHG). In this case, one of the first and second HFETs HT10 and HT20 may be an n-type HFET, while the other thereof may be a p-type HFET. FIG. 1 shows an example in which the first HFET HT10 is an n-type HFET including a 2DEG and the second HFET HT20 is a p-type HFET including a 2DHG. Hereinafter, structures of the first and second HFETs HT10 and HT20 will be described in detail.

The first HFET HT10 may include a first channel layer C10 and a first channel supply layer CS10 formed on the first surface (e.g., top surface) of the substrate SUB10. The first HFET HT10 may further include a first gate electrode G10, a first source electrode S10, and a first drain electrode D10 on the first channel supply layer CS10. The first source electrode S10 and drain electrode D10 may at least partially fill recesses defined by the channel supply layer CS10 and channel layer C10. The first channel layer C10 may be a semiconductor layer. The first channel layer C10 may include a Group III-V compound semiconductor. For example, the first channel layer C10 may include a gallium nitride (GaN)-based material. In this case, the first channel layer C10 may be an undoped GaN layer, but the first channel layer C10 may alternatively be a GaN layer doped with impurities according to circumstances. The first channel layer C10 may be a layer formed using an epitaxial growth process. Although not shown, a buffer layer may be further formed between the substrate SUB10 and the first channel layer C10. The buffer layer may be formed to reduce differences in lattice constants and coefficients of thermal expansion between the substrate SUB10 and the first channel layer C10 and also reduce (and/or prevent) a drop (and/or deterioration) in the crystallinity of the first channel layer C10. The buffer layer may have a single or multilayered structure including at least one material selected from nitrides containing at least one of aluminum (Al), gallium (Ga), indium (In), and boron (B). In an example, the buffer layer may have a single or multilayered structure including at least one of various materials consisting of aluminum nitride (AlN), gallium nitride (GaN), aluminum gallium nitride (AlGaN), indium gallium nitride (InGaN), aluminum indium nitride (AlInN), and aluminum gallium indium nitride (AlGaInN). The first channel supply layer CS10 may be a semiconductor layer that is different from the first channel layer C10. The first channel supply layer CS10 may be a layer configured to cause a 2DEG in the first channel layer C10. The 2DEG may be formed in a portion of the first channel layer C10 under an interface between the first channel layer C10 and the first channel supply layer CS10. The first channel supply layer CS10 may include a material (semiconductor) having a different polarization characteristic and/or energy bandgap and/or lattice constant from the first channel layer C10. The first channel supply layer CS10 may include a material (e.g., semiconductor) having higher polarizability and/or wider energy bandgap than the first channel layer C10. For example, the first channel supply layer CS10 may have a single or multilayered structure including at least one selected from nitrides containing at least one of aluminum (Al), gallium (Ga), indium (In), and boron (B). In an example, the first channel supply layer CS10 may have a single or multilayered structure including at least one of various materials consisting of AlGaN, AlInN, InGaN, AlN, and AlInGaN. Although the first channel supply layer CS10 may be an undoped layer, the first channel supply layer CS10 may be a layer doped with desired (and/or alternatively predetermined) impurities. The first channel supply layer CS10 may have a thickness of about several tens of nm (for example, about 100 nm or less and/or about 50 nm or less), and may be formed by an epitaxial growth process like the first channel layer C10.

The first gate electrode G10 may be provided in a desired (and/or alternatively predetermined) region of the first channel supply layer CS10. The first gate electrode G10 may be formed of a metal or a metal compound. The first source electrode S10 and the first drain electrode D10 may be formed so they are spaced apart from both sides of the first gate electrode G10. The first and second source and drain electrodes S10 and D10 may be electrically connected to the 2DEG. For example, after portions of the first channel supply layer CS10 and the first channel layer C10 are etched (or recessed), the first and second source and drain electrodes S10 and D10 may be formed in the etched regions (or recessed regions). In this case, the etched regions (or recessed regions) may have a greater depth than the 2DEG. Accordingly, the first and second source and drain electrodes S10 and D10 may be in direct contact with side surfaces of the 2DEG. However, example embodiments are not limited thereto. For example, the first source and drain electrodes S10 and D10 may be formed after the first channel supply layer CS10 is etched to only a partial thickness. Alternatively, the first source and drain electrodes S10 and D10 may be formed on a top surface of the channel supply layer CS10 without performing an etch process.

The second HFET HT20 may include a second channel layer C20 and a second channel supply layer CS20 formed below the second surface (e.g., a bottom surface) of the substrate SUB10 and support the substrate SUB10, and may further include a second gate electrode G20, a second source electrode S20, and a second drain electrode D20 below and/or in the second channel supply layer CS20. For example, the second gate electrode G20 may be formed below and/or contact the second channel supply layer CS20. For example, the second source electrode S20 and second drain electrode D20 may at least partially fill recesses defined by the second channel supply layer CS20 and channel layer C10. The second channel supply layer CS20 may be a layer configured to cause a 2DHG in the second channel layer C20. The 2DHG may be formed in a portion of the second channel layer C20 adjacent to the interface between the second channel layer C20 and the second channel supply layer CS20. The second channel layer C20 may include the same material as or a similar material to the first channel supply layer CS10. The second channel supply layer CS20 may include the same material as or a similar material to the first channel layer C10. In an example, the second channel layer C20 and the second channel supply layer CS20 may include AlGaN and GaN, respectively. However, materials forming the second channel layer C20 and the second channel supply layer CS20 may be variously changed. The second channel layer C20 and the second channel supply layer CS20 may be formed using an epitaxial growth process. Materials and structures of the second gate electrode G20, the second source electrode S20, and the second drain electrode D20 included in the second channel supply layer CS20 may be the same as or similar to those of the first gate electrode G10, the first source electrode S10, and the first drain electrode D10. In this case, the second source electrode S20 may be provided in a position corresponding to the first drain electrode D10, and the second drain electrode D20 may be provided in a position corresponding to the first source electrode S10. The second gate electrode G20 may be disposed to correspond to the first gate electrode G10.

The first HFET HT10 and the second HFET HT20 may be electrically connected to each other. The first gate electrode G10 of the first HFET HT10 may be connected to the second gate electrode G20 of the second HFET HT20, and the first drain electrode D10 of the first HFET HT10 may be connected to the second source electrode S20 of the second HFET HT20. The first and second gate electrodes G10 and G20 may be connected to each other through a first conductive plug CP10, and the first drain electrode D10 and the second source electrode S20 may be connected to each other through a second conductive plug CP20. The first and second conductive plugs CP10 and CP20 may penetrate the substrate SUB10. First and second via holes H10 and H20 may penetrate the first channel supply layer CS10, the first channel layer C10, the substrate SUB10, the second channel layer C20, and the second channel supply layer CS20. The first and second conductive plugs CP10 and CP20 may be provided in the first and second via holes H10 and H20, respectively. The first conductive plug CP10 may be electrically isolated from the 2DEG and the 2DHG. To this end, an insulating layer IL10 may be provided on an inner side surface of the first via hole H10, and a first conductive plug CP10 may be provided in the insulating layer IL10.

Although FIG. 1 shows a case where the substrate SUB10 is a single substrate, the substrate SUB10 may have a different structure. For example, the substrate SUB10 may include a plurality of stacked unit substrates, that is, a multi-substrate structure. An example of the multi-substrate structure is illustrated in FIG. 2.

Figure 2:
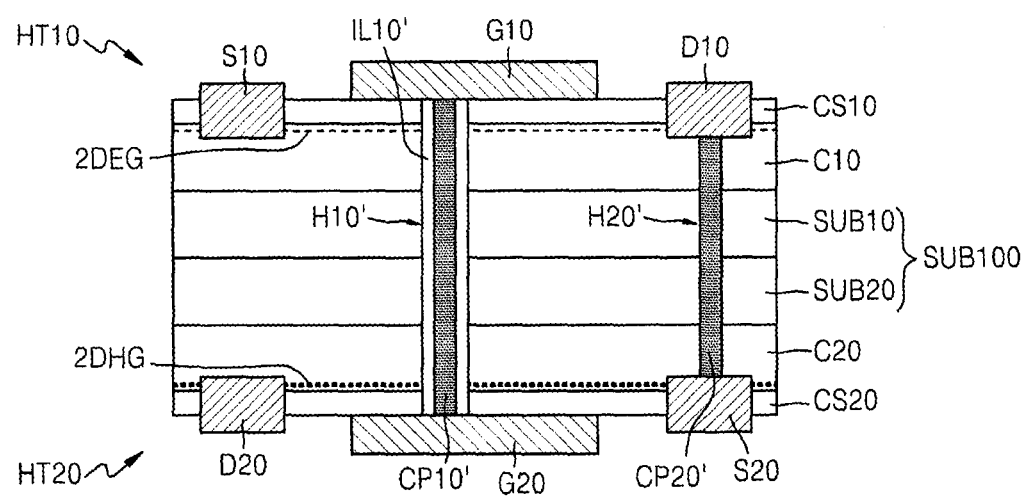
FIG. 2 is a cross-sectional view illustrating a semiconductor device according to example embodiments.

Referring to FIG. 2, a substrate SUB100 may include a first substrate SUB10 and a second substrate SUB20. The second substrate SUB20 may be provided under the first substrate SUB10. The first substrate SUB10 may be formed of, for example, silicon, sapphire, or silicon carbide. The second substrate SUB20 may be formed of, for example, silicon, sapphire, or silicon carbide. The first and second substrates SUB10 and SUB20 may be the same or different from each other. A first HFET HT10 may be formed on a top surface of the first substrate SUB10, and a second HFET HT20 may be formed a bottom surface of the second substrate SUB20. The first HFET HT10 may include a first channel layer C10, a first channel supply layer CS10, a first gate electrode G10, a first source electrode S10, and a first drain electrode D10. The second HFET HT20 may include a second channel layer C20, a second channel supply layer CS20, a second gate electrode G20, a second source electrode S20, and a second drain electrode D20. The structure of each of the first and second HFETs HT10 and HT20 may be the same as or similar to that described with reference to FIG. 1. The first and second gate electrodes G10 and G20 may be connected to each other through a first conductive plug CP10' provided within a first via hole H10', while the first drain electrode D10 and the second source electrode S20 may be connected to each other through a second conductive plug CP20' provided within a second via hole H20'. An insulating layer IL10' may be provided on an inner side surface of the first via hole H10', and the first conductive plug CP10' may be provided in the insulating layer IL10'. The first conductive plug CP10' may be electrically isolated from a 2DEG and a 2DHG by the insulating layer IL10'.

Figure 3:
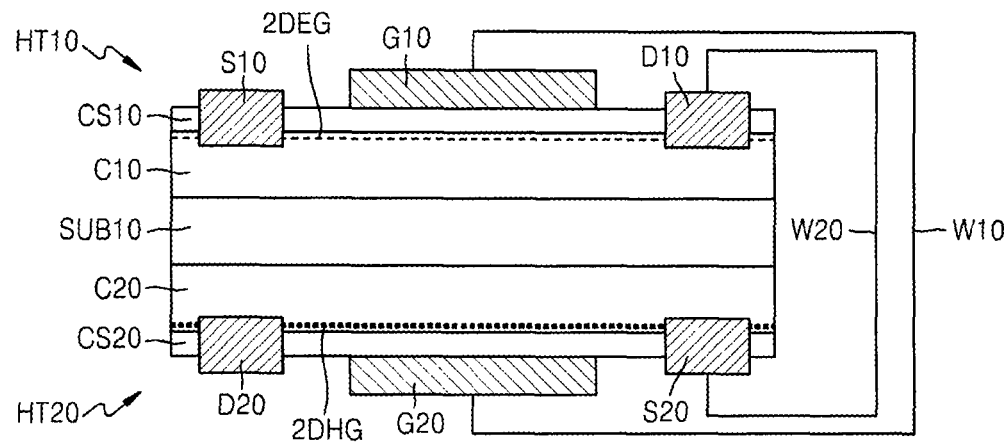
FIG. 3 is a cross-sectional view illustrating a semiconductor device according to example embodiments.
Figure 4:
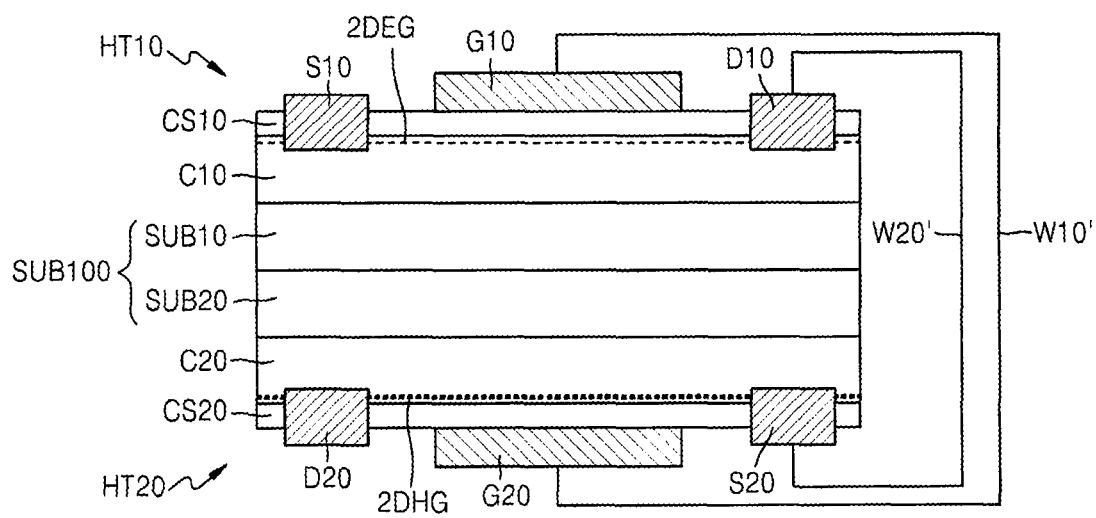
FIG. 4 is a cross-sectional view illustrating a semiconductor device according to example embodiments.

Although FIGS. 1 and 2 illustrate a case where the first and second HFETs HT10 and HT20 are connected to each other using the conductive plugs CP10, CP10', CP20, and CP20', a method of connecting the first and second HFETs HT10 and HT20 may be changed. For example, the first and second HFETs HT10 and HT20 may be connected using bonding wires as shown in FIGS. 3 and 4. FIG. 3 illustrates a modified structure of FIG. 1, while FIG. 4 illustrates a modified structure of FIG. 2.

Referring to FIGS. 3 and 4, the first gate electrode G10 of the first HFET HT10 may be connected to the second gate electrode G20 of the second HFET HT20 using first bonding wires W10 and W10'. The first drain electrode D10 of the first HFET HT10 may be connected to the second source electrode S20 of the second HFET HT20 using second bonding wires W20 and W20'. The first bonding wires W10 and W10' and the second bonding wires W20 and W20' may be connection elements provided outside the substrate SUB10 and SUB100.

According to example embodiments, the connection method shown in FIGS. 1 and 2 may be combined with the connection method shown in FIGS. 3 and 4. That is, a portion of the first HFET HT10 may be connected to a portion of the second HFET HT20 using a conductive plug, and another portion of the first HFET HT10 may be connected to another portion of the second HFET HT20 using a bonding wire. In addition, the connection method may be variously modified.

Figure 5:
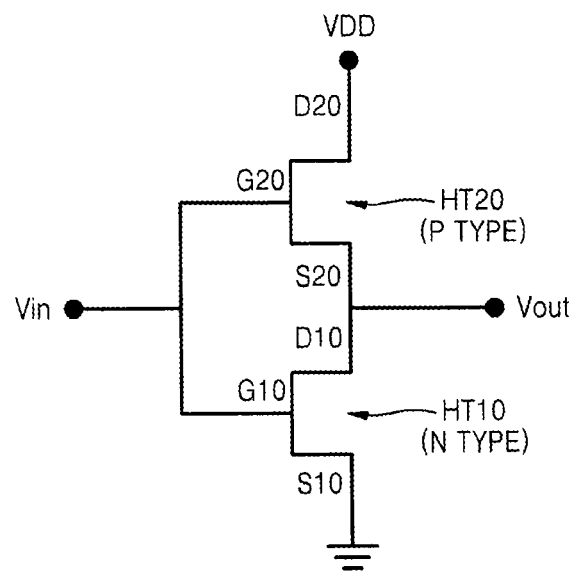
FIG. 5 is a circuit diagram illustrating semiconductor devices according to example embodiments of FIGS. 1 through 4.

FIG. 5 is a circuit diagram of semiconductor devices according to example embodiments shown in FIGS. 1 through 4.

Referring to FIG. 5, a first HFET HT10 and a second HFET HT20 may be connected to each other. The first HFET HT10 may be an n-type transistor, and the second HFET HT20 may be a p-type transistor. A power supply terminal VDD may be connected to a second drain electrode D20 of the second HFET HT20. A second source electrode S20 of the second HFET HT20 may be connected to a first drain electrode D10 of the first HFET HT10. An output terminal Vout may be connected to the second source electrode S20 and the first drain electrode D10. A first source electrode S10 of the first HFET HT10 may be grounded. A first gate electrode G10 of the first HFET HT10 and a second gate electrode G20 of the second HFET HT20 may be connected to each other, and an input terminal Vin may be connected to the first and second gate electrodes G10 and G20.

When a desired (and/or predetermined) high voltage is applied to the input terminal Vin with a desired (and/or predetermined) operating voltage applied through the power supply terminal VDD, the first HFET HT10 may be turned on, and the second HFET HT20 may be turned off so that a low-level signal may be output through the output terminal Vout. Meanwhile, when a desired (and/or predetermined) low voltage is applied to the input terminal Vin with a desired (and/or predetermined) operating voltage applied through the power supply terminal VDD, the first HFET HT10 may be turned off, and the second HFET HT20 may be turned on, so that a high-level signal may be output through the output terminal Vout. That is, a signal having an opposite level to the signal input to the input terminal Vin may be output through the output terminal Vout. The circuit shown in FIG. 5 may be an inverter. The inverter may be a logic inverter.

Figure 6:
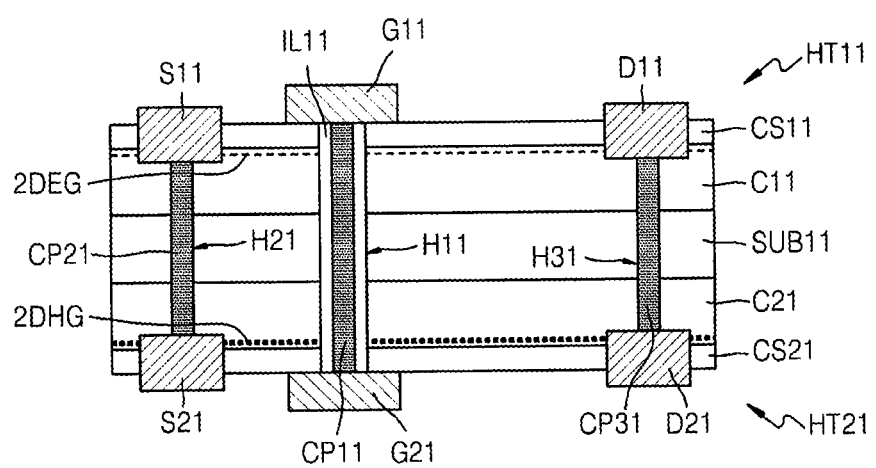
FIG. 6 is a cross-sectional view illustrating a semiconductor device according to example embodiments.

FIG. 6 is a cross-sectional view of a semiconductor device according to example embodiments.

Referring to FIG. 6, a first HFET HT11 may be formed on a first surface (e.g., a top surface) of a substrate SUB11, and a second HFET HT21 may be formed under a second surface (e.g., a bottom surface) of the substrate SUB11, wherein the second surface may face the first surface. The first and second HFETs HT11 and HT21 may have different characteristics from each other and be electrically connected to each other. The first HFET HT11 may be an n-type HFET including a 2DEG, while the second HFET HT21 may be a p-type HFET including a 2DHG. The first HFET HT11 may include a first channel layer C11, a first channel supply layer CS11, a first gate electrode G11, a first source electrode S11, and a first drain electrode D11. The second HFET HT21 may include a second channel layer C21, a second channel supply layer CS21, a second gate electrode G21, a second source electrode S21, and a second drain electrode D21. Materials of the first channel layer C11, the first channel supply layer CS11, the first gate electrode G11, the first source electrode S11, and the first drain electrode D11 may be respectively similar to those of the first channel layer C10, the first channel supply layer CS10, the first gate electrode G10, the first source electrode S10, and the first drain electrode D10 of FIG. 1. Also, materials of the second channel layer C21, the second channel supply layer CS21, the second gate electrode G21, the second source electrode S21, and the second drain electrode D21 may be respectively similar to those of the second channel layer C20, the second channel supply layer CS20, the second gate electrode G20, the second source electrode S20, and the second drain electrode D20 of FIG. 1. The second source electrode S21 may be disposed to correspond to the first source electrode S11, and the second drain electrode D21 may be disposed to correspond to the first drain electrode D11. The second gate electrode G21 may be disposed to correspond to the first gate electrode G11. Also, he first gate electrode g11 may be disposed closer to the first source electrode S11 than to the first drain electrode D11. Similarly, the second gate electrode G21 may be disposed closer to the second source electrode S21 than to the second drain electrode D21. Since a semiconductor device according to example embodiments may be used as an element of a power device, the disposition of the gate electrodes G11 and G21 closer to the source electrodes S11 and S21 than to the drain electrodes D11 and D21 may be advantageous to improving operating characteristics. However, positional relationships between the gate electrodes G11 and G21 and the source and drain electrodes S11, S21, D11, and D21 are not limited to the above description.

As illustrated in FIG. 6, the first gate electrode G11, the first source electrode S11, and the first drain electrode D11 may be respectively connected to the second gate electrode G21, the second source electrode S21, and the second drain electrode D21 through first through third conductive plugs CP11, CP21, and CP31 provided to penetrate the substrate SUB11. The first through third conductive plugs CP11, CP21, and CP31 may be provided within first through third via holes H11, H21, and H31, respectively. The first and second gate electrodes G11 and G21 may be connected by the first conductive plug CP11, the first and second source electrodes S11 and S21 may be connected by the second conductive plug CP21, and the first and second drain electrodes D11 and D21 may be connected by the third conductive plug CP31. The first conductive plug CP11 may be electrically isolated from the 2DEG and 2DHG. To this end, an insulating layer IL11 may be provided within the first via hole H11 to surround the first conductive plug CP11.

A method of connecting the first and second HFETs HT11 and HT21 is not limited to the above description and may be variously changed. In an example, the first and second HFETs HT11 and HT21 may be connected by bonding wires formed outside the substrate SUB11 as shown in FIG. 7.

Figure 7:
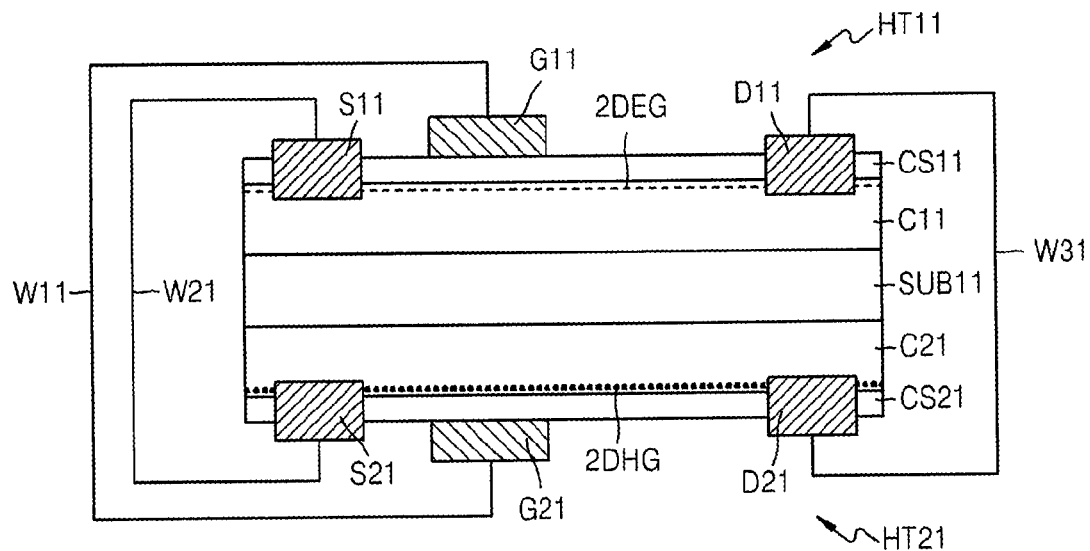
FIG. 7 is a cross-sectional view illustrating a semiconductor device according to example embodiments.

Referring to FIG. 7, a first gate electrode G11 of a first HFET HT11 may be connected to a second gate electrode G21 of a second HFET HT21 by a first bonding wire W11, and a first source electrode S11 of the first HFET HT11 may be connected to a second source electrode S21 of a second HFET HT21 by the second bonding wire W21. Also, a first drain electrode D11 of the first HFET HT11 may be connected to a second drain electrode D21 of the second HFET HT21 by a third bonding wire W31.

According to example embodiments, the connection method shown in FIG. 6 may combine with the connection method shown in FIG. 7. That is, a portion of the first HFET HT11 may be connected to a portion of the second HFET HT21 using a conductive plug, while another portion of the first HFET HT11 may be connected to another portion of the second HFET HT21 using a bonding wire.

Although FIGS. 6 and 7 illustrate a case in which the substrate SUB11 is a single substrate, the structure of the substrate SUB11 may be modified. For instance, the substrate SUB11 may have a structure in which a plurality of unit substrates are stacked, that is, a multi-substrate structure. That is, the substrate SUB11 may have the same structure as or a similar structure to the substrate (or multi-substrate structure) SUB100 of FIGS. 2 and 4.

Figure 8:
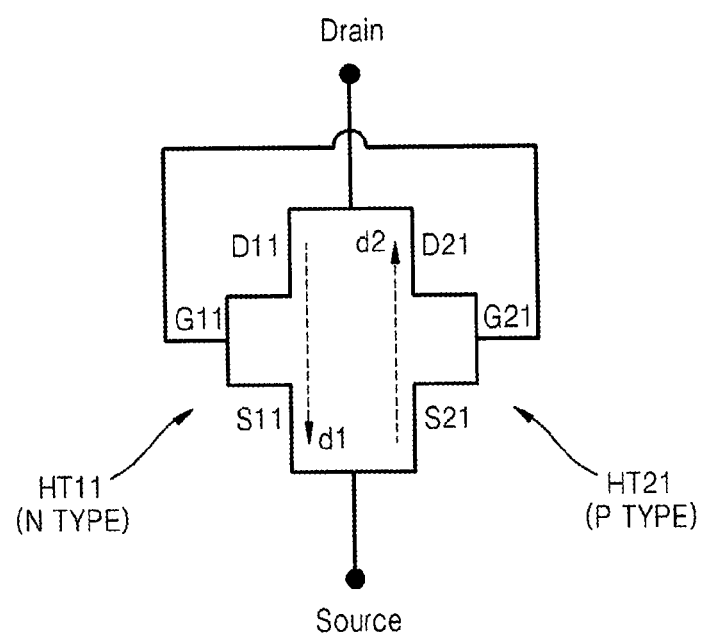
FIG. 8 is a circuit diagram illustrating semiconductor devices according to example embodiments of FIGS. 6 and 7.

FIG. 8 is a circuit diagram of semiconductor devices according to example embodiments of FIGS. 6 and 7.

Referring to FIG. 8, a first HFET H11 and a second H21 may be connected to each other. The first HFET H11 may be an n-type transistor, while the second HFET H21 may be a p-type transistor. A first gate electrode G11 of the first HFET H11 may be connected to a second gate electrode G21 of the second HFET H21, and a first source electrode S11 of the first HFET H11 may be connected to a second source electrode S21 of the second HFET H21. A first drain electrode D11 of the first HFET H11 may be connected to a second drain electrode D21 of the second HFET H21. When a voltage equal to or higher than a threshold voltage of the first HFET H11 is applied to the gate electrodes G11 and G21, only the first HFET H11 of the first and second HFETs H11 and H21 may be selectively turned on, and a current may flow through the first HFET H11 in a first direction (e.g., forward direction) d1. Meanwhile, when a voltage of 0V or a negative (−) voltage is applied to the gate electrodes G11 and G21, only the second HFET H21 of the first and second HFETs H11 and H21 may be selectively turned on, and a current may flow through the second HFET H21 in a second direction (e.g., a reverse direction) d2. Thus, when a gate voltage Vg is 0V or a negative (−) voltage, the second HFET H21 may allow the flow of current in the second direction (e.g., a reverse direction) d2 so that the second HFET H21 can function as a free wheeling diode (FWD) or a fast recovery diode (FRD). The semiconductor device of FIG. 8 may be used in a power device (e.g., power inverter).

Figure 9:
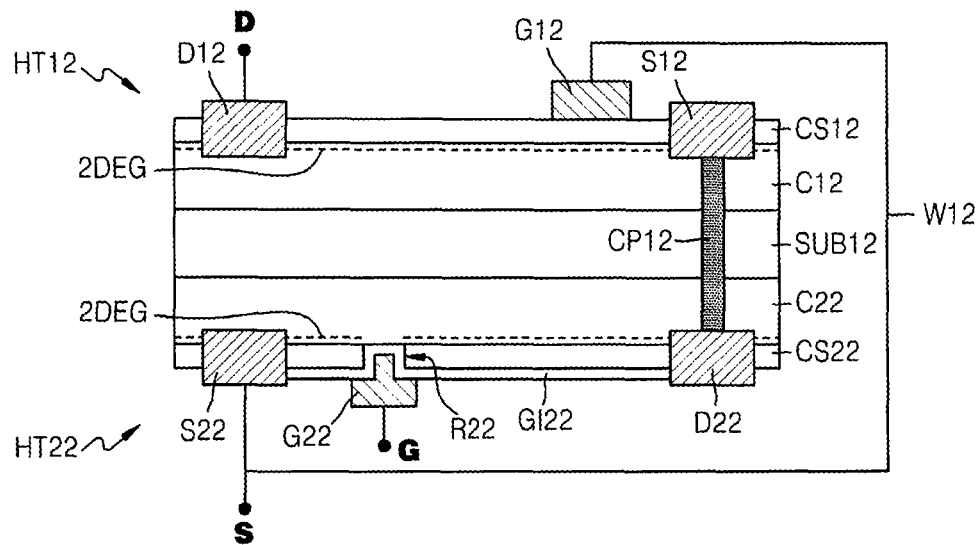
FIG. 9 is a cross-sectional view illustrating a semiconductor device according to example embodiments.

FIG. 9 is a cross-sectional view of a semiconductor device according to example embodiments.

Referring to FIG. 9, a first HFET HT12 may be provided at a first surface (e.g., top surface) of a substrate SUB12, and a second HFET HT22 may be provided at a second surface (e.g., bottom surface) of the substrate SUB12, which may face the first surface. The substrate SUB12 may be formed of, for example, silicon, sapphire, or silicon carbide. However, the substrate SUB12 is not limited to the above-described kinds and may be variously changed. The first and second HFETs HT12 and HT22 may have different characteristics and be electrically connected to each other. Each of the first and second HFETs HT12 and HT22 may include a 2DEG. That is, each of the first and second HFETs HT12 and HT22 may be a high electron mobility transistor (HEMT). In this case, one of the first and second HFETs HT12 and HT22 may have normally-on characteristics, while the other thereof may have normally-off characteristics. FIG. 9 illustrates a case in which the first HFET HT12 is a normally-on HEMT, while the second HFET HT22 is a normally-off HEMT.

The first HFET HT12 may include a first channel layer C12, a first channel supply layer CS12, a first gate electrode G12, a first source electrode S12, and a first drain electrode D12 formed on the first surface (e.g., a top surface) of the substrate SUB12. Materials of the first channel layer C12, the first channel supply layer CS12, the first gate electrode G12, the first source electrode S12, and the first drain electrode D12 may be respectively similar to or the same as those of the first channel layer C10, the first channel supply layer CS10, the first gate electrode G10, the first source electrode S10, and the first drain electrode D10 of FIG. 1. The first gate electrode G12 may be disposed closer to the first source electrode S12 than to the first drain electrode D12.

The second HFET HT22 may include a second channel layer C22, a second channel supply layer CS22, a second gate electrode G22, a second source electrode S22, and a second drain electrode D22 formed on the second surface (e.g., a bottom surface) of the substrate SUB12. Materials of the second channel layer C22, the second channel supply layer CS22, the second gate electrode G22, the second source electrode S22, and the second drain electrode D22 may be respectively similar to or the same as those of the first channel layer C12, the first channel supply layer CS12, the first gate electrode G12, the first source electrode S12, and the first drain electrode D12. The second gate electrode G22 may be disposed closer to the second source electrode S22 than to the second drain electrode D22. The second drain electrode D22 may be disposed to correspond to the first source electrode S12, while the second source electrode S22 may be disposed to correspond to the first drain electrode D12.

The second HFET HT22 may include a recess region R22 provided in the second channel supply layer CS22. For example, the recess region R22 may be formed until an interface between the second channel supply layer CS22 and the second channel layer C22, or may have a depth greater or less than the interface. The second gate electrode G22 may be disposed in the recess region R22. A gate insulating layer GI22 may be further provided between the recess region R22 and the second gate electrode G22. Due to the recess region R22, the 2DEG may be cut (interrupted) at a portion of the second channel layer C22 corresponding to the recess region R22 or the characteristics thereof may be changed. In this connection, the second HFET HT22 may have normally-off properties.

The first and second HFETs HT12 and HT22 may be connected as a cascode type (configuration). In this case, the second drain electrode D22 of the second HFET HT22 may be connected to the first source electrode S12 of the first HFET HT12. Also, the first gate electrode G12 of the first HFET HT12 may be connected to the second source electrode S22 of the second HFET HT22. In this case, the first source electrode S12 and the second drain electrode D22 may be connected to each other by a conductive plug CP12 penetrating the substrate SUB12. Meanwhile, the first gate electrode G12 and the second source electrode S22 may be connected to each other by a bonding wire W12. Thus, when the first and second HFETs HT12 and HT22 are connected as a cascode type, the semiconductor device including the first and second HFETs HT12 and HT22 connected to each other may be referred to as a 'cascode device.'

Although FIG. 9 illustrates a case in which the substrate SUB12 is a single substrate, a multi-substrate structure may be used instead of the single substrate. An example of the multi-substrate structure is illustrated in FIG. 10.

Figure 10:
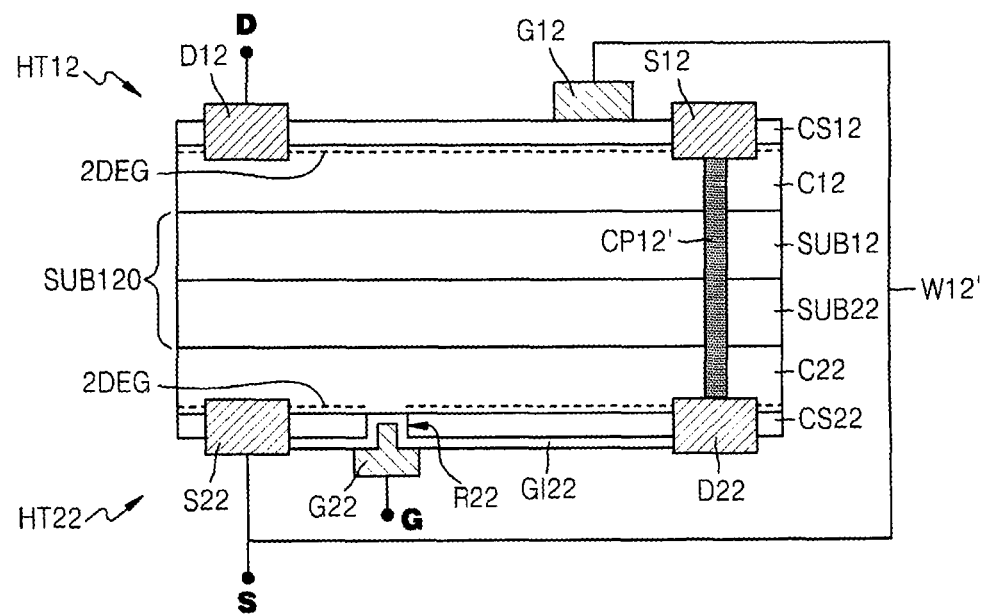
FIG. 10 is a cross-sectional view illustrating a semiconductor device according to example embodiments.

Referring to FIG. 10, a substrate SUB120 may include a first substrate SUB12 and a second substrate SUB22. The second substrate SUB22 may be provided under the first substrate SUB12. The substrate SUB may be formed of, for example, silicon, sapphire, or silicon carbide. The second substrate SUB22 may be formed of, for example, silicon, sapphire, or silicon carbide. Although the first and second substrates SUB12 and SUB22 may be the same substrates, the first and second substrates SUB12 and SUB22 may be different substrates. A first HFET HT12 may be formed on a top surface of the first substrate SUB12, while a second HFET HT22 may be formed on a bottom surface of the second substrate SUB22. The first source electrode S12 and the second drain electrode D22 may be connected to each other by a conductive plug CP12' formed to penetrate the substrate SUB120. Meanwhile the first gate electrode G12 and the second source electrode S22 may be connected using a bonding wire W12'.

Figure 11:
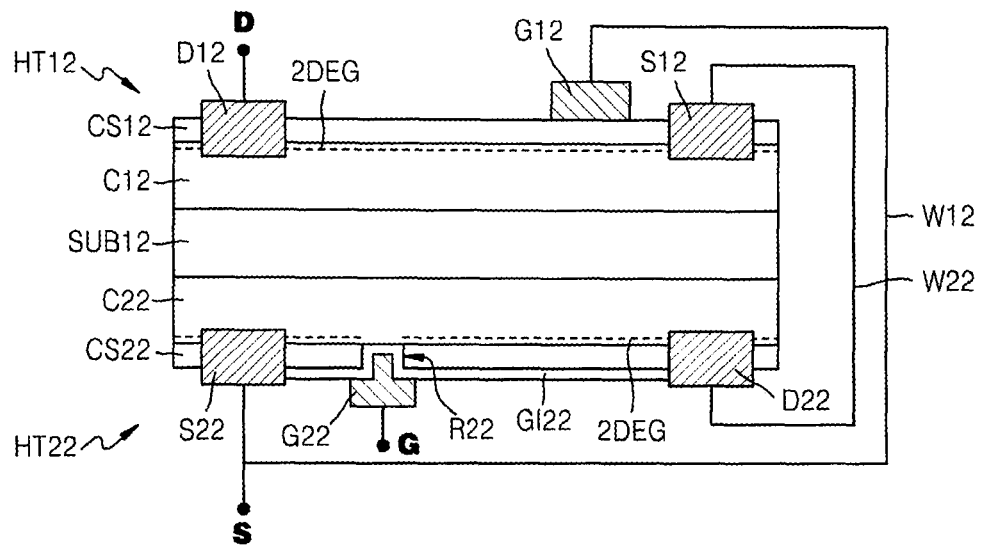
FIG. 11 is a cross-sectional view illustrating a semiconductor device according to example embodiments.
Figure 12:
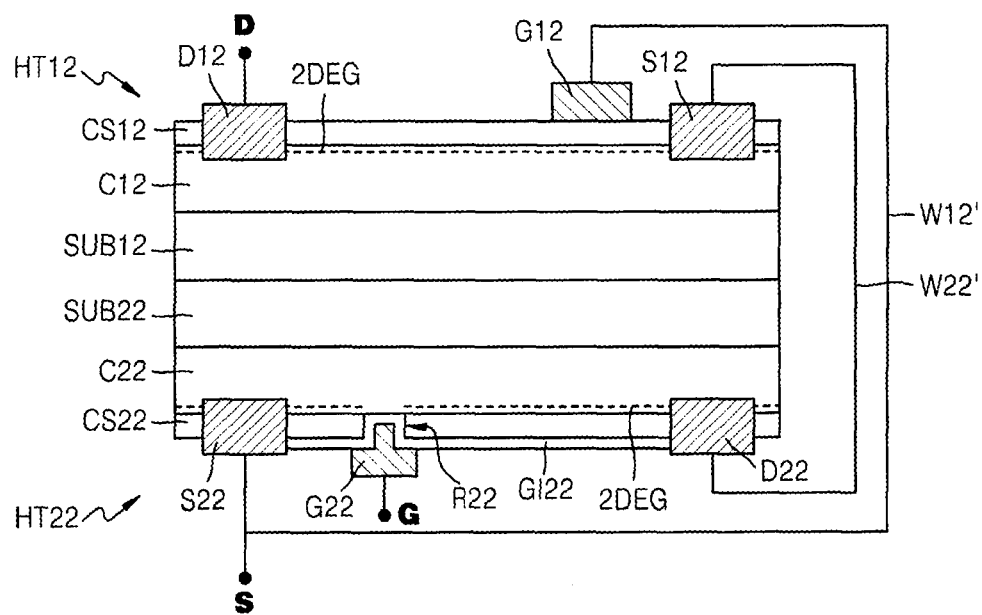
FIG. 12 is a cross-sectional view illustrating a semiconductor device according to example embodiments.

The method of connecting the first source electrode S12 and the second drain electrode D22 as described with reference to FIGS. 9 and 10 may be modified. For instance, as shown in FIGS. 11 and 12, the first source electrode S12 and the second drain electrode D22 may be connected by second bonding wires W22 and W22'. In this case, the bonding wires W12 and W12' configured to connect the first gate electrode G12 and the second source electrode S22 may be referred to as 'first bonding wires.'

Figure 13:
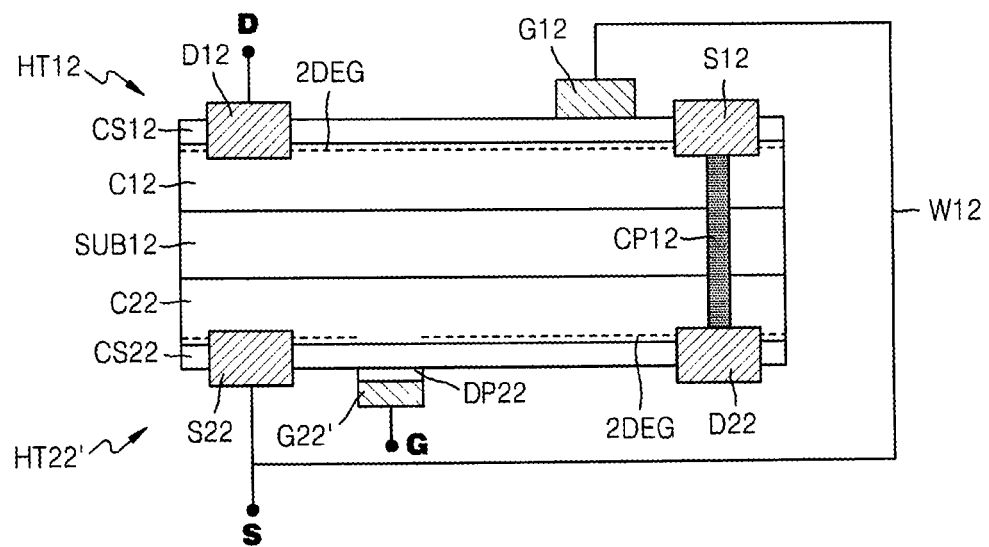
FIG. 13 is a cross-sectional view illustrating a semiconductor device according to example embodiments.
Figure 14:
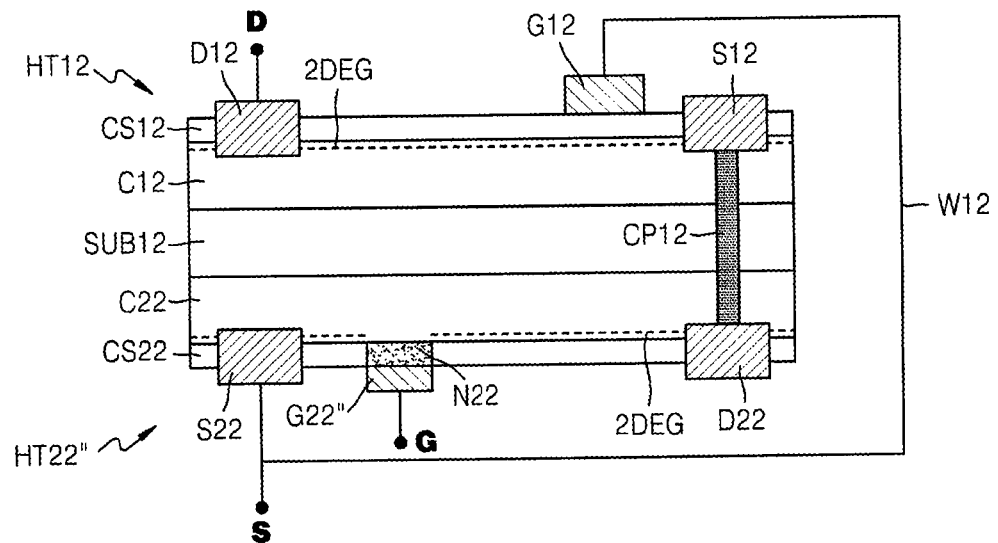
FIG. 14 is a cross-sectional view illustrating a semiconductor device according to example embodiments.

Although an HEMT (e.g., the second HFET HT22) having normally-off properties is embodied using the recess region R22 in example embodiments of FIGS. 9 through 12, a method for embodying a normally-off HEMT may be variously modified. For example, an HEMT having normally-off properties may be embodied using a depletion forming layer or an ion-implanted region. Examples of normally-off HEMTs formed using the depletion forming layer or the ion-implanted region are illustrated in FIGS. 13 and 14. FIG. 13 shows a case in which a depletion forming layer DP22 is used, while FIG. 14 shows a case in which an ion-implanted region N22 is used.

FIG. 13 is a cross-sectional view of a semiconductor device according to example embodiments.

Referring to FIG. 13, the depletion forming layer DP22 may be provided between a second channel supply layer CS22 and a second gate electrode G22'. The depletion forming layer DP22 may be a p-type semiconductor layer or a layer doped with p-type impurities (e.g., a p-doped layer). Also, the depletion forming layer DP22 may include a Group III-V nitride semiconductor. For example, the depletion forming layer DP22 may include at least one of GaN, AlGaN, InN, AlInN, InGaN, and AlInGaN, and be doped with p-type impurities, such as magnesium (Mg). In an example, the depletion forming layer DP22 may be a p-GaN layer or a p-AlGaN layer. The depletion forming layer DP22 may serve to form a depletion region in a 2DEG that is caused by the second channel supply layer CS22 to the second channel layer C22. An energy bandgap of a portion of the second channel layer C22 corresponding to the depletion forming layer DP22 may be elevated due to the depletion forming layer DP22. As a result, the depletion region may be formed in the 2DEG disposed in the portion of the second channel layer C22. Accordingly, a 2DEG portion corresponding to the depletion forming layer DP22 may be cut or have different properties (e.g., electron concentration) from the remaining region. In this connection, the second HFET HT22' according to example embodiments may have normally-off properties. The semiconductor device of FIG. 13 may have the same structure as that of FIG. 9 except for the construction of the second HFET HT22'.

FIG. 14 is a cross-sectional view of a semiconductor device according to example embodiments.

Referring to FIG. 14, an ion-implanted region N22 may be provided in a partial region of a second channel supply layer CS22, and a second gate electrode G22" may be provided in a position corresponding to the ion-implanted region N22. A gate insulating layer (not shown) may be further provided between the ion-implanted region N22 and the second gate electrode G22". The ion-implanted region N22 may be a region implanted with, for example, impurities such as argon (Ar) or nitrogen (N). The ion-implanted region N22 may be formed to a depth corresponding to the inside of the second channel layer C22, a depth corresponding to an interface between the second channel layer C22 and the second channel supply layer CS22, or a depth less than the interface.

Due to the implantation of impurities, the crystallinity of the second channel supply layer CS22 or the crystallinity of the second channel supply layer CS22 and the second channel layer C22 may be broken and changed into an amorphous state. Accordingly, the ion-implanted region N22 may be an amorphous region. A 2DEG portion corresponding to the ion-implanted region N22 may not be formed, or properties of the 2DEG portion may be changed by the ion-implanted region N22. In this connection, the second HFET HT22" according to example embodiments may have normally-off properties. The semiconductor device of FIG. 14 may have the same structure as that in FIG. 9 except for the construction of the second HFET HT22".

Although FIGS. 9-14 illustrate examples in which the HEMTs HT22, HT22', and HT22" having normally-off properties are formed using the recess region (refer to R22 in FIG. 9), the depletion forming layer (refer to DP22 in FIG. 13), and the ion-implanted region (refer to N22 in FIG. 14), a normally-off HEMT may be formed using another method and applied to semiconductor devices according to example embodiments.

Figure 15:
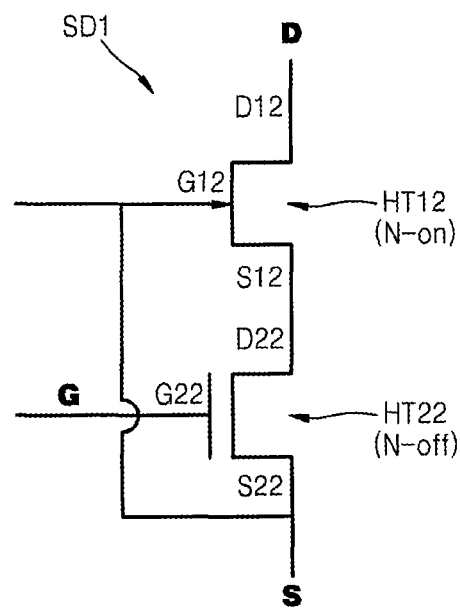
FIG. 15 is a circuit diagram illustrating semiconductor devices according to example embodiments of FIGS. 9 through 14.

FIG. 15 is a circuit diagram of semiconductor devices according to example embodiments of FIGS. 9 through 14.

Referring to FIG. 15, a semiconductor device SD1 may include a first HFET HT12 and a second HFET HT22 connected to each other. The first HFET HT12 may have normally-on properties. When the first HFET HT12 has the normally-on properties, the first HFET HT12 may serve as a depletion-mode (D-mode) transistor. The first HFET HT12 may be a high electron mobility transistor (HEMT). For example, the first HFET HT12 may be a nitride-based HEMT. A nitride used in the first HFET HT12 may be a gallium nitride-based material. The first HFET HT12 may correspond to the first HFET HT12 of FIGS. 9 through 14. The second HFET HT22 may have normally-off properties. When the second HFET HT22 has normally-off properties, the second FET HT22 may serve as an enhancement-mode (E-mode) transistor. The second HFET HT22 may be a gallium nitride-based HEMT. The second HFET HT22 may correspond to each of the second HFETs HT22, HT22', and HT22" of FIGS. 9 through 14.

By connecting the second HFET HT22 having normally-off properties to the first HFET HT12 having normally-on properties, the first HFET HT12 may be used as a normally-off device. In other words, although the first HFET HT12 has normally-on properties, a device (e.g., the semiconductor device SD1) in which the first HFET HT12 is connected to the second HFET HT22 may have normally-off properties due to the second HFET HT22.

The first and second HFETs HT12 and HT22 may be connected in a cascode configuration. When a source, drain, and gate of the first HFET HT12 are respectively denoted by S12, D12, and G12 and a source, drain, and gate of the second HFET HT22 are respectively denoted by S22, D22, and G22, the drain D22 of the second HFET HT22 may be connected to the source S12 of the first HFET HT12. Also, the gate G12 of the first HFET HT12 may be connected to the source S22 of the second HFET HT22.

The semiconductor device SD1 in which the first HFET HT12 is connected to the second HFET HT22 may operate as a single transistor. In this case, a source, drain, and gate of the semiconductor device SD1 may be respectively denoted by S22, D12, and G22. That is, the source S22 of the second HFET HT22, the drain D12 of the first HFET HT12, and the gate G22 of the second HFET HT22 may be respectively used as the source, drain, and gate of the semiconductor device SD1. For brevity, the source, drain, and gate of the semiconductor device SD1 may be respectively denoted by S, D, and G. The source S, the drain D, and the gate G of the semiconductor device SD1 may respectively correspond to the source S22 of the second HFET HT22, the drain D12 of the first HFET HT12, and the gate G22 of the second HFET HT22.

When the second HFET HT22 is turned on, it may be inferred that the semiconductor device SD1 is turned on. Since the first HFET HT12 has normally-on properties, an on or off state of the semiconductor device SD1 may be determined by the second HFET HT22 having normally-off properties. When the second HFET HT22 is turned on and a desired (and/or predetermined) voltage is applied between the drain D12 of the first HFET HT12 and the source S22 of the second HFET HT22, a desired (and/or predetermined) current may flow from the drain D12 to the source S22. Other properties than a threshold voltage, for example, a breakdown voltage characteristic or a reverse characteristic, may be mainly determined by the first HFET HT12. Thus, good breakdown-voltage and reverse characteristics may be ensured due to the first HFET HT12.

According to example embodiments, HFETs having different properties may be formed on both surfaces of a substrate and electrically connected to each other to manufacture devices having various structures. Therefore, practicability and applicability of the HFETs may be increased, and various devices having the HFETs may be easily made. In particular, since a semiconductor device is made by forming HFETs on both surfaces of a substrate and electrically connecting the HFETs, the semiconductor device may be downscaled, and the integration density of the semiconductor device may be improved. According to example embodiments, since unnecessary interconnections may be omitted or the length of interconnections may be reduced, a parasitic inductance may be easily reduced.

As mentioned above, various semiconductor devices according to example embodiments may be applied in various fields including a power device and a logic device for various purposes. For example, semiconductor devices according to example embodiments may be used in a power inverter, a radio-frequency (RF) power amplifier, a cascode device, a power conversion system, and a logic inverter. However, semiconductor devices according to example embodiments are not limited to the above-described application fields, and the semiconductor devices according to example embodiments may be used in any devices including a plurality of transistors.

FIGS. 16A through 16E are cross-sectional views illustrating a method of manufacturing a semiconductor device according to example embodiments.

Figure 16A:
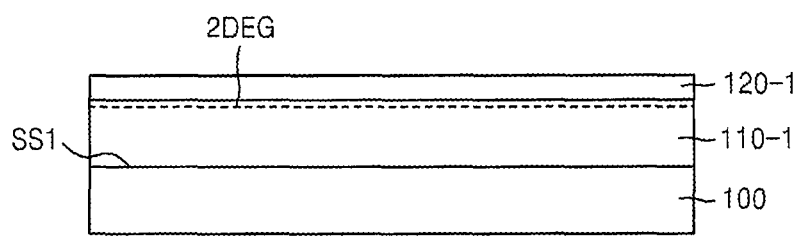
FIGS. 16A through 16E are cross-sectional views illustrating a method of manufacturing a semiconductor device according to example embodiments.

Referring to FIG. 16A, a first channel layer 110-1 and a first channel supply layer 120-1 may be sequentially formed on a first surface SS1 of a substrate 100. The substrate 100 may be formed of, for example, silicon, sapphire, or silicon carbide. However, the substrate 100 is not limited to the above-described kinds and may be variously changed. Materials of the first channel layer 110-1 and the first channel supply layer 120-1 may be respectively the same as or similar to those of the first channel layer C10 and the first channel supply layer CS10 of FIG. 1. Accordingly, the first channel layer 110-1 and the first channel supply layer 120-1 may include different gallium nitride-based materials. A 2DEG may be formed in the first channel layer 110-1 by the first channel supply layer 120-1.

Figure 16B:
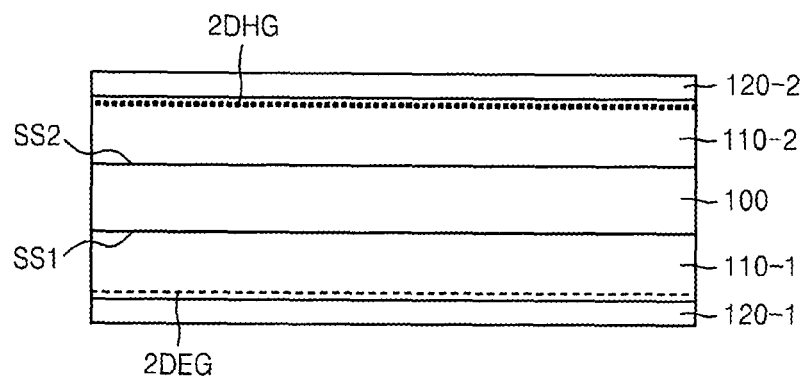

Referring to FIG. 16B, with the structure of FIG. 16A turned upside down, a second channel layer 110-2 and a second channel supply layer 120-2 may be sequentially formed on a second surface SS2 of the substrate 100. Materials of the second channel layer 110-2 and the second channel supply layer 120-2 may be respectively the same as or similar to those of the second channel layer C20 and the second channel supply layer CS20 of FIG. 1. Accordingly, the second channel layer 110-2 and the second channel supply layer 120-2 may include different gallium nitride-based materials. A 2DHG may be formed in the second channel layer 110-2 by the second channel supply layer 120-2.

Figure 16C:
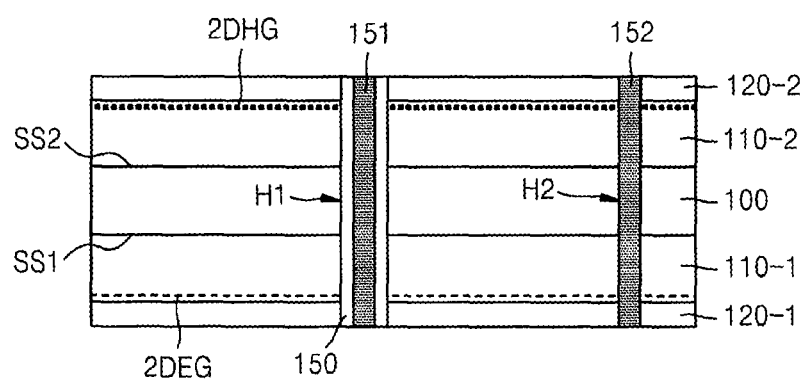

Referring to FIG. 16C, first and second via holes H1 and H2 may be formed through the second channel supply layer 120-2, the second channel layer 110-2, the substrate 100, the first channel layer 110, and the first channel supply layer 120, and first and second conductive plugs 151 and 152 may be formed within the first and second via holes H1 and H2. The first conductive plug 151 may be electrically isolated from the 2DEG and the 2DHG. To this end, an insulating layer 150 may be formed on an inner side surface of the first via hole H1, and a first conductive plug 151 may be formed in the insulating layer 150.

Figure 16D:
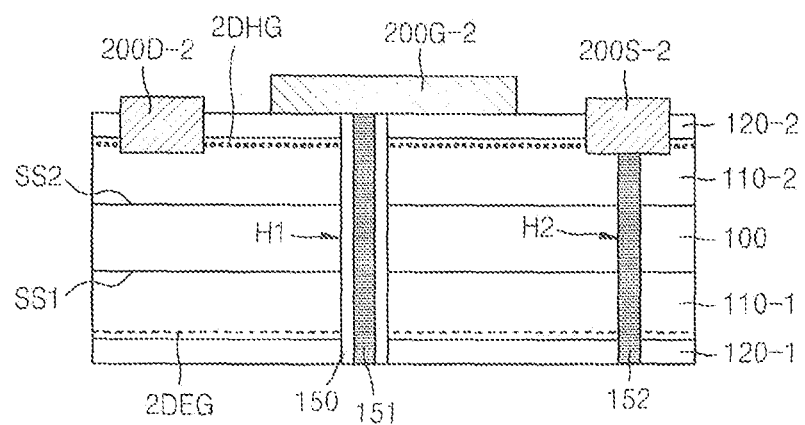

Referring to FIG. 16D, a second gate electrode 200G-2, a second source electrode 200S-2, and a second drain electrode 200D-2 may be formed on the second channel supply layer 120-2. The second gate electrode 200G-2 may be in contact with the first conductive plug 151, and the second source electrode 200S-2 may be in contact with the second conductive plug 152. The second source electrode 200S-2 and the second drain electrode 200D-2 may be electrically connected to the 2DHG. For example, portions of the second channel supply layer 120-2 and the second channel layer 110-2 may be etched (or recessed), and a second source electrode 200S-2 and a second drain electrode 200D-2 may be formed in etched regions (or recessed regions). In this case, the etched regions (or recess regions) may have a greater depth than the 2DHG. Accordingly, the second source and drain electrodes 200S-2 and 200D-2 may be in direct contact with side surfaces of the 2DHG. However, the present embodiment is not limited thereto. For example, the second source and drain electrodes 200S-2 and 200D-2 may be formed after the second channel supply layer 120-2 is etched only to a partial thickness. Alternatively, the second source and drain electrodes 200S-2 and 200D-2 may be formed on a top surface of the second channel supply layer 120-2 without performing an etch process.

Figure 16E:
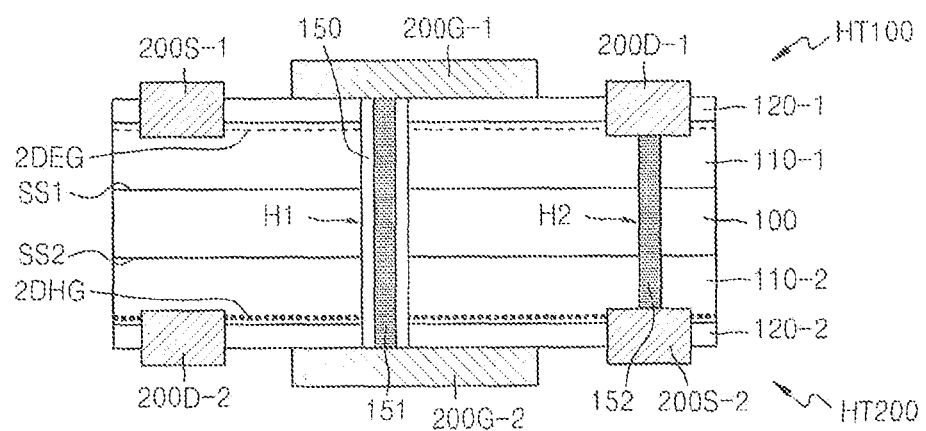

Referring to FIG. 16E, with the structure of FIG. 16D turned upside down, a first gate electrode 200G-1, a first source electrode 200S-1, and a first drain electrode 200D-1 may be formed on the first channel supply layer 120. The first gate electrode 200G-1 may be in contact with the first conductive plug 151, while the first drain electrode 200D-1 may be in contact with the second conductive plug 152.

In FIG. 16E, the first channel layer 110-1, the first channel supply layer 120-1, the first gate electrode 200G-1, the first source electrode 200S-1, and the first drain electrode 200D-1 may constitute a first HFET HT100. Meanwhile, the second channel layer 110-2, the second channel supply layer 120-2, the second gate electrode 200G-2, the second source electrode 200S-2, and the second drain electrode 200D-2 may constitute a second HFET HT200. The first HFET HT100 may be an n-type HFET, while the second HFET HT200 may be a p-type HFET. The first and second HFETs HT100 and HT200 may be electrically connected to each other. The structure of FIG. 16E may be substantially the same as or similar to that of FIG. 1.

FIGS. 17A through 17H are cross-sectional views illustrating a method of manufacturing a semiconductor device according to example embodiments.

Figure 17A:
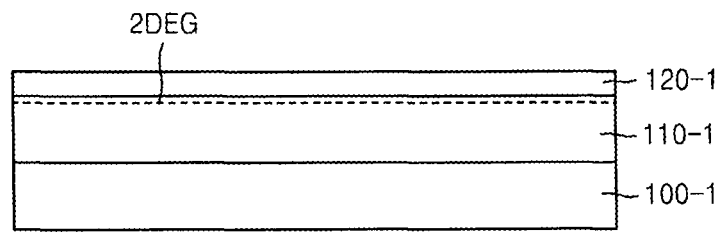
FIGS. 17A through 17H are cross-sectional views illustrating a method of manufacturing a semiconductor device according to example embodiments.

Referring to FIG. 17A, a first channel layer 110-1 and a first channel supply layer 120-1 may be sequentially formed on a first substrate 100-1. The first substrate 100-1, the first channel layer 110-1, and the first channel supply layer 120-1 may respectively correspond to the substrate 100, the first channel layer 110-1, and the first channel supply layer 120-1 of FIG. 16A. A 2DEG may be formed in the first channel layer 110-1 by the first channel supply layer 120-1.

Figure 17B:
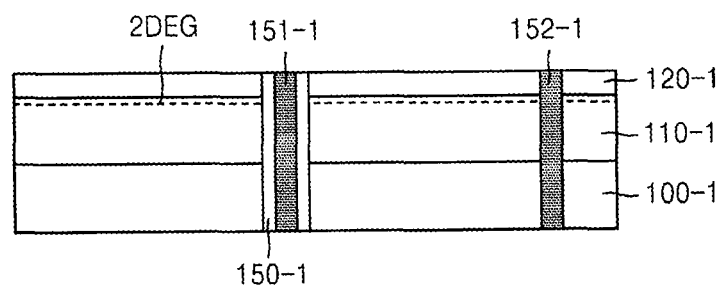

Referring to FIG. 17B, first and second conductive plugs 151-1 and 152-1 may be formed through the first substrate 100-1, the first channel layer 110-1, and the first channel supply layer 120-1. The first conductive plug 151-1 may be electrically isolated from the 2DEG. To this end, after forming an insulating layer 150-1 within a via hole in which the first conductive plug 151-1 is formed, the first conductive plug 151-1 may be formed in the insulating layer 150-1.

Figure 17C:
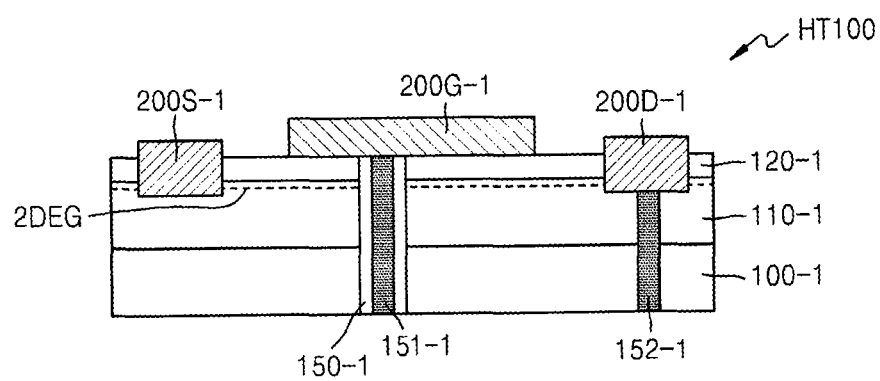

Referring to FIG. 17C, a first gate electrode 200G-1, a first source electrode 200S-1, and a first drain electrode 200D-1 may be formed on the first channel supply layer 120-1. The first gate electrode 200G-1 may be in contact with the first conductive plug 151-1, while the first drain electrode 200D-1 may be in contact with the second conductive plug 152-1. The first channel layer 110-1, the first channel supply layer 120-1, the first gate electrode 200G-1, the first source electrode 200S-1, and the first drain electrode 200D-1 may constitute a first HFET HT100. The first HFET HT100 may be an n-type transistor.

Figure 17D:
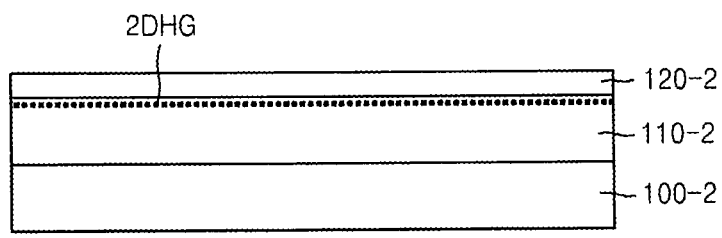

Referring to FIG. 17D, a second channel layer 110-2 and a second channel supply layer 120-2 may be sequentially formed on a second substrate 100-2. Materials of the second substrate 100-2, the second channel layer 110-2, and the second channel supply layer 120-2 may be respectively the same as or similar to those of the substrate 100, the second channel layer 110-2, and the second channel supply layer 120-2 of FIG. 16B. A 2DHG may be formed in the second channel layer 110-2 by the second channel supply layer 120-2.

Figure 17E:
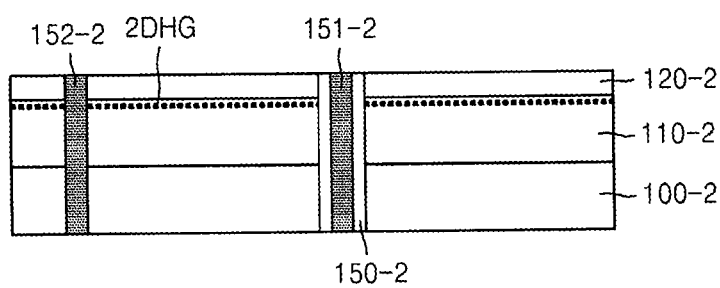

Referring to FIG. 17E, first and second conductive plugs 151-2 and 152-2 may be formed through the second substrate 100-2, the second channel layer 110-2, and the second channel supply layer 120-2. The first conductive plug 151-2 may be electrically isolated from the 2DHG. To this end, after forming an insulating layer 150-2 within a via hole in which the first conductive plug 151-2 is formed, the first conductive plug 151-2 may be formed in the first insulating layer 150-2.

Figure 17F:
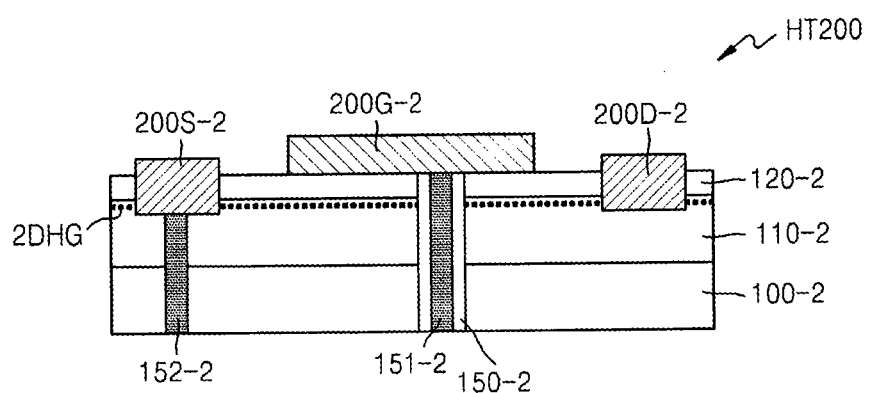

Referring to FIG. 17F, a second gate electrode 200G-2, a second source electrode 200S-2, and a second drain electrode 200D-2 may be formed on the second channel supply layer 120-2. The second gate electrode 200G-2 may be in contact with the first conductive plug 151-2, while the first source electrode 200S-2 may be in contact with the second conductive plug 152-2. The second channel layer 110-2, the second channel layer 120-2, the second gate electrode 200G-2, the second source electrode 200S-2, and the second drain electrode 200D-2 may constitute a second HFET HT200. The second HFET HT200 may be a p-type transistor.

Figure 17G:
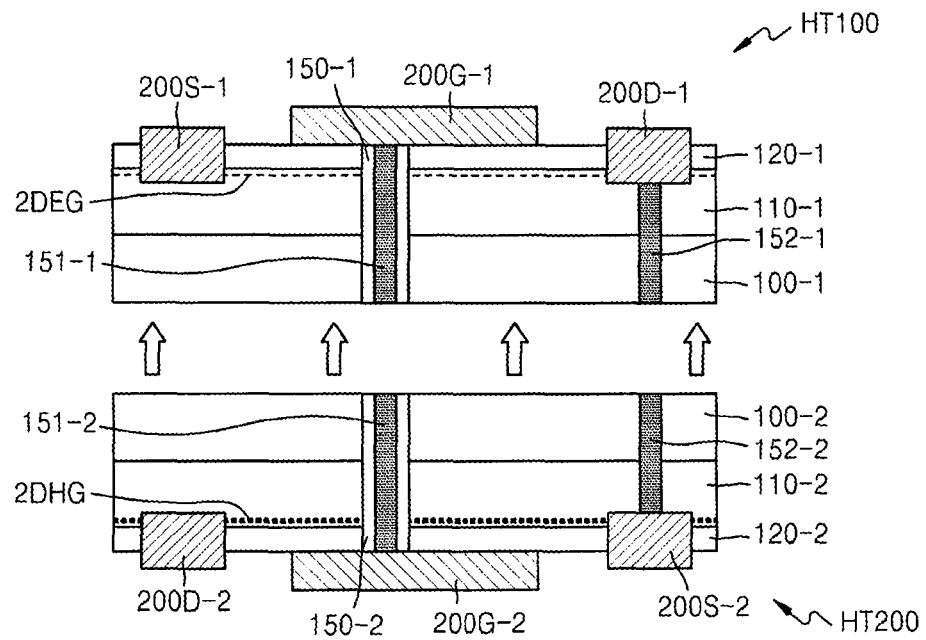
Figure 17H:
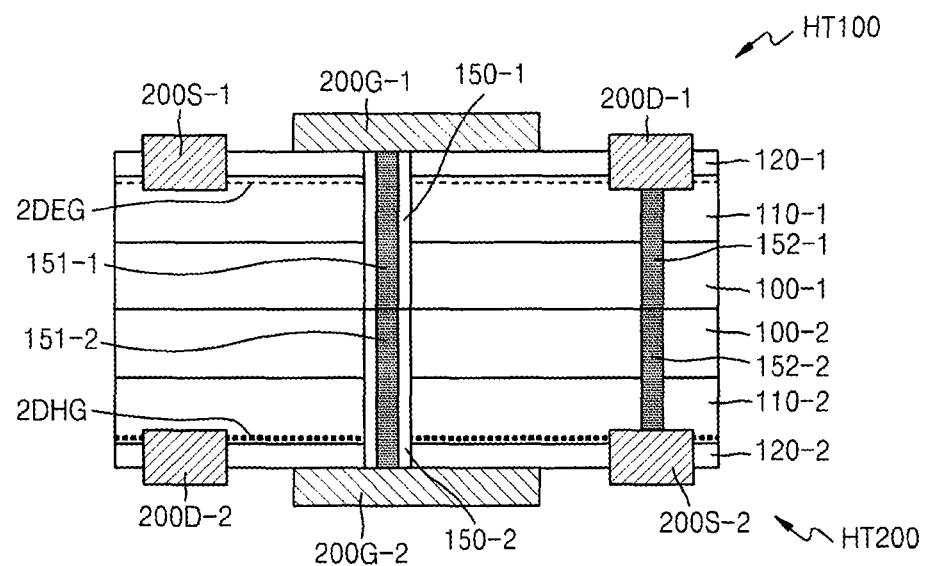

Referring to FIGS. 17G and 17H, the second substrate 100-2 having the second HFET HT200 may be adhered to the first substrate 100-1 having the first HFET HT100. As a result, as shown in FIG. 17H, a semiconductor device including the first and second substrates 100-1 and 100-2 between the first and second HFETs HT100 and HT200 may be formed. The first and second substrates 100-1 and 100-2 may constitute a single 'substrate'. The first conductive plug 151-1 of the first HFET HT100 may be connected to the first conductive plug 151-2 of the second HFET HT200. The second conductive plug 152-1 of the first HFET HT100 may be connected to the second conductive plug 152-2 of the second HFET HT200. Accordingly, the first gate electrode 200G-1 may be connected to the second gate electrode 200G-2 by the connected first conductive plugs 151-1 and 151-2, while the first drain electrode 200D-1 may be connected to the second source electrode 200S-2 by the connected second conductive plugs 152-1 and 152-2. The structure of FIG. 17H may be substantially the same as or similar to that of FIG. 2.

Figure 18A:
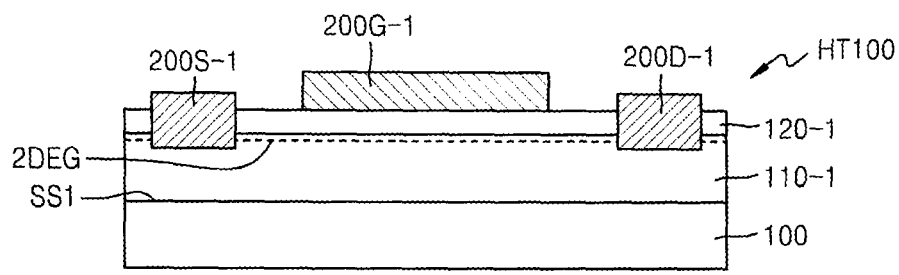
FIGS. 18A through 18C are cross-sectional views illustrating a method of manufacturing a semiconductor device according to example embodiments.
Figure 18B:
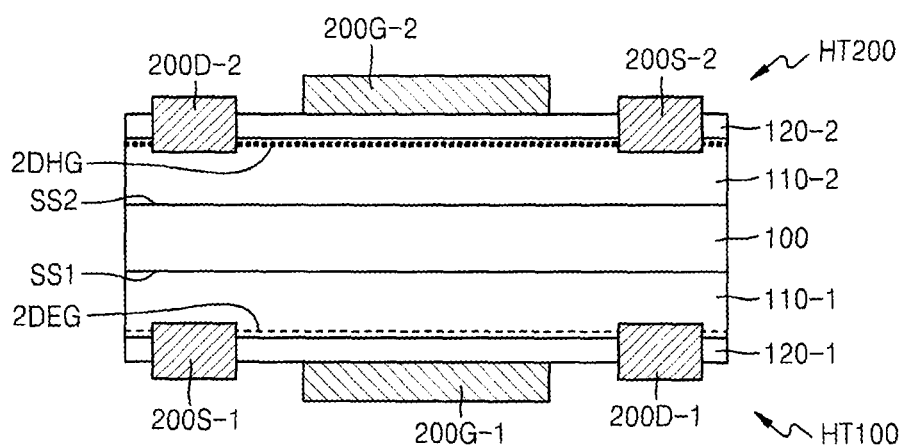
Figure 18C:
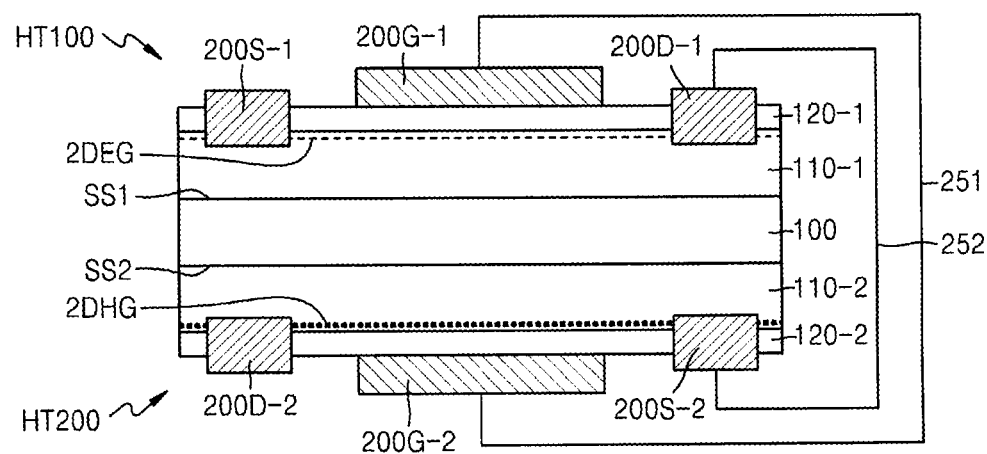

FIGS. 18A through 18C are cross-sectional views illustrating a method of manufacturing a semiconductor device according to example embodiments.

Referring to FIG. 18A, a first channel layer 110-1 and a first channel supply layer 120-1 may be sequentially formed on a first surface SS1 of a substrate 100. The first substrate 100-1, the first channel layer 110-1, and the first channel supply layer 120-1 may respectively correspond to the substrate 100, the first channel layer 110-1, and the first channel supply layer 120-1 of FIG. 16A. A 2DEG may be formed in the first channel layer 110-1 by the first channel supply layer 120-1. Next, a first gate electrode 200G-1, a first source electrode 200S-1, and a first drain electrode 200D-1 may be formed in the first channel supply layer 120-1. The first channel layer 110-1, the first channel supply layer 120-1, the first gate electrode 200G-1, the first source electrode 200S-1, and the first drain electrode 200D-1 may constitute a first HFET HT100.

Referring to FIG. 18B, with the structure of FIG. 18A turned upside down, a second channel layer 110-2 and a second channel supply layer 120-2 may be sequentially formed on a second surface SS2 of the substrate 100. Materials of the second channel layer 110-2 and the second channel supply layer 120-2 may be respectively the same as or similar to those of the second channel layer 110-2 and the second channel supply layer 120-2 of FIG. 16B. A 2DHG may be formed in the second channel layer 110-2 by the second channel supply layer 120-2. Next, a second gate electrode 200G-2, a second source electrode 200G-2, and a second drain electrode 200D-2 may be formed in the second channel supply layer 120-2. The second channel layer 110-2, the second channel supply layer 120-2, the second gate electrode 200G-2, the second source electrode 200S-2, and the second drain electrode 200D-2 may constitute a second HFET HT200.

Referring to FIG. 18C, with the structure of FIG. 18B turned upside down, first and second bonding wires 251 and 252 may be formed to connect the first and second HFETs HT100 and HT200. The first and second gate electrodes 200G-1 and 200G-2 may be connected by the first bonding wire 251, while the first drain electrode 200D-1 and the second source electrode 200S-2 may be connected by the second bonding wire 252. The first and second bonding wires 251 and 252 may be formed, for example, during a packaging process. The structure of FIG. 18C may be substantially the same as or similar to that of FIG. 3.

The method described with reference to FIGS. 16A through 16E, the method described with reference to FIGS. 17A through 17H, and the method described with reference to FIGS. 18A through 18C may be applied to the manufacture of the semiconductor devices of FIGS. 4, 6, and 7 and modified structures thereof. Since methods of manufacturing the semiconductor devices of FIGS. 4, 6, and 7 and the modified structures thereof would be easily understood by one skilled in the art, a detailed description thereof is omitted.

FIGS. 19A through 19F are cross-sectional views illustrating a method of manufacturing a semiconductor device according to example embodiments.

Figure 19A:
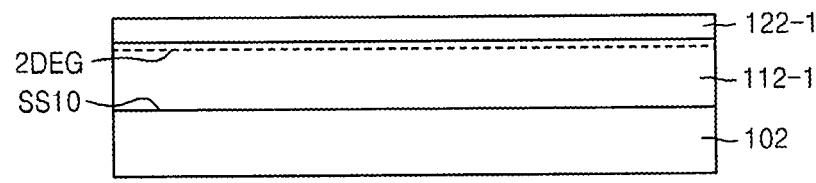
FIGS. 19A through 19F are cross-sectional views illustrating a method of manufacturing a semiconductor device according to example embodiments.

Referring to FIG. 19A, a first channel layer 112-1 and a first channel supply layer 122-1 may be sequentially formed on a first surface SS10 of a substrate 102. The substrate 102 may be formed of, for example, silicon, sapphire, or silicon carbide. However, the substrate 102 is not limited to the above-described kinds and may be variously changed. Materials of the first channel layer 112-1 and the first channel supply layer 122-1 may be respectively the same as or similar to those of the first channel layer C12 and the first channel supply layer CS12 of FIG. 9. Accordingly, the first channel layer 112-1 and the first channel supply layer 122-1 may include different gallium nitride-based materials. A 2DEG may be formed in the first channel layer 112-1 by the first channel supply layer 122-1.

Figure 19B:
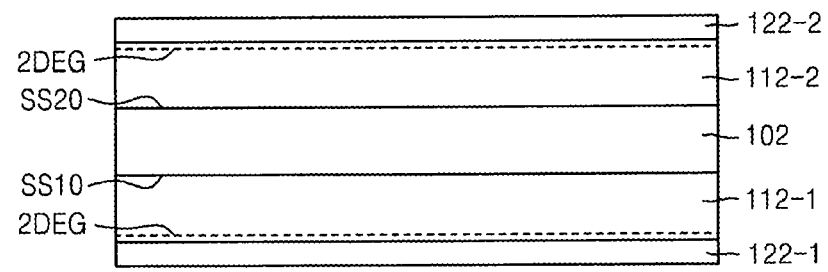

Referring to FIG. 19B, with the structure of FIG. 19A turned upside down, a second channel layer 112-2 and a second channel supply layer 122-2 may be sequentially formed on a second surface SS20 of the substrate 102. Materials of the second channel layer 112-2 and the second channel supply layer 122-2 may be respectively the same as or similar to those of the second channel layer C22 and the second channel supply layer CS22 of FIG. 9. Accordingly the second channel layer 112-2 and the second channel supply layer 122-2 may include different gallium nitride-based materials. A 2DHG may be formed in the second channel layer 112-2 by the second channel supply layer 122-2.

Figure 19C:
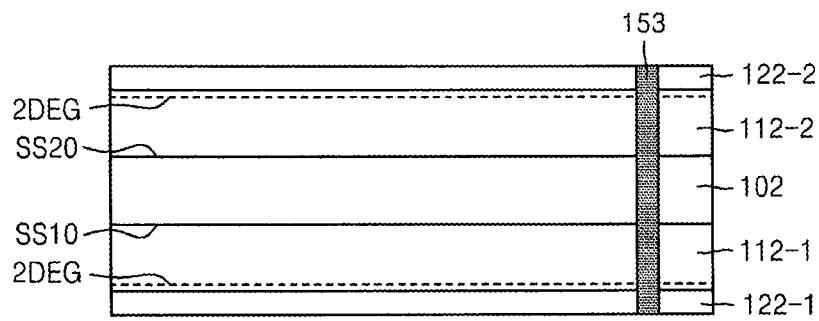

Referring to FIG. 19C, a conductive plug 153 may be formed through the second channel supply layer 122-2, the second channel layer 112-2, the substrate 102, the first channel layer 112-1, and the first channel supply layer 122-1.

Figure 19D:
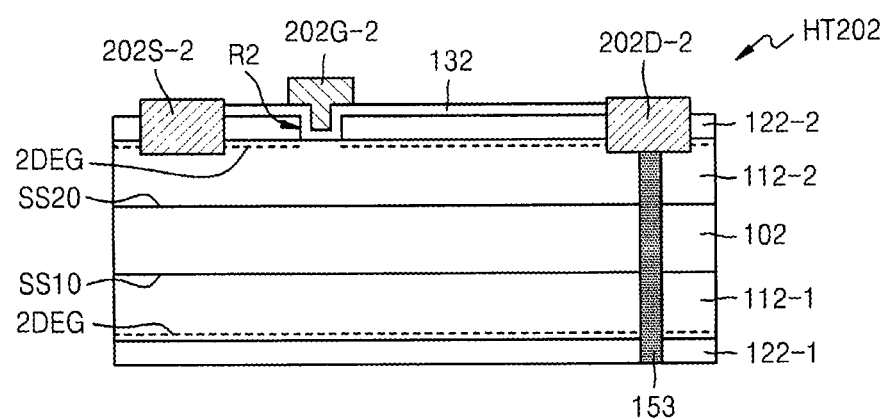

Referring to FIG. 19D, a partial region of the second channel supply layer 122-2 may be etched (or recessed) to form a recess region R2, and a gate insulating layer 132 may be formed on the recess region R2. A second gate electrode 202G-2 may be formed on the gate insulating layer 132 disposed on the recess region R2. Also, a second source electrode 202S-2 and a second drain electrode 202D-2 may be formed on the second channel supply layer 122-2 on both sides of the second gate electrode 202G-2. The second drain electrode 202D-2 may be connected to (or in contact with) the conductive plug 153. The second channel layer 112-2, the second channel supply layer 122-2, the second gate electrode 202G-2, the second source electrode 202S-2, and the second drain electrode 202D-2 may constitute a second HFET HT202. The second HFET HT202 may be an HEMT and have normally-off properties.

Figure 19E:
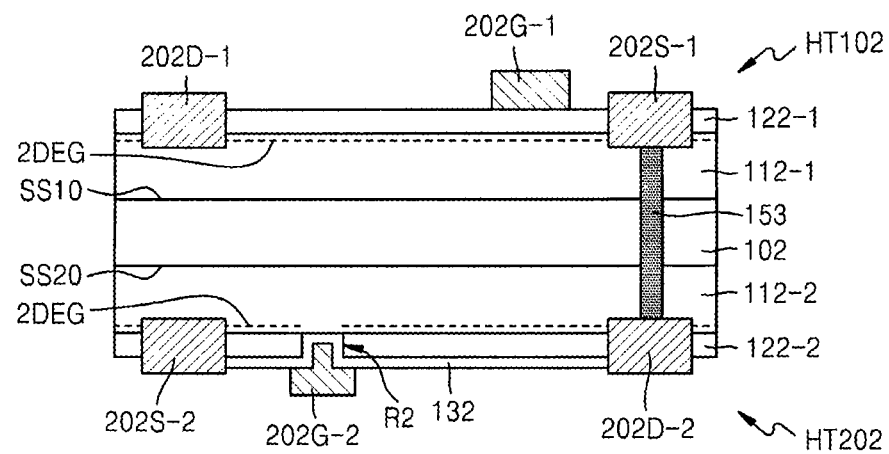

Referring to FIG. 19E, with the structure of FIG. 19D turned upside down, a first gate electrode 202G-1, a first source electrode 202S-1, and a first drain electrode 202D-1 may be formed on the first channel supply layer 122-1. The first source electrode 202S-1 may be connected to (or in contact with) the conductive plug 153. Accordingly, the first source electrode 202S-1 may be connected to the second drain electrode 202D-2 by the conductive plug 153. In FIG. 19E, the first channel layer 112-1, the first channel supply layer 122-1, the first gate electrode 202G-1, the first source electrode 202S-1, and the first drain electrode 202D-1 may constitute a first HFET HT102. The first HFET HT102 may be an HEMT and have normally-on properties.

Figure 19F:
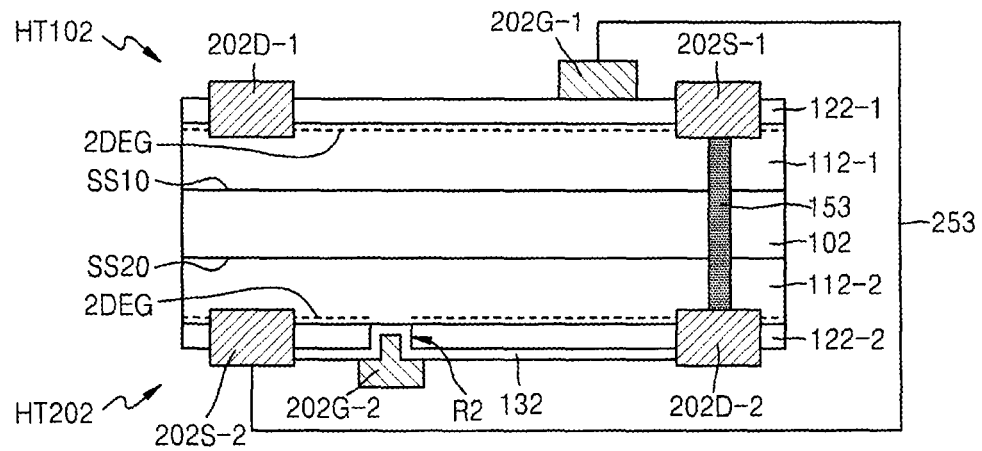

Referring to FIG. 19F, a bonding wire 253 may be formed to connect the first gate electrode 202G-1 and the second source electrode 202S-2. The structure of FIG. 19F may be substantially the same as or similar to that of FIG. 9.

FIGS. 20A through 20E are cross-sectional views illustrating a method of manufacturing a semiconductor device according to example embodiments.

Figure 20A:
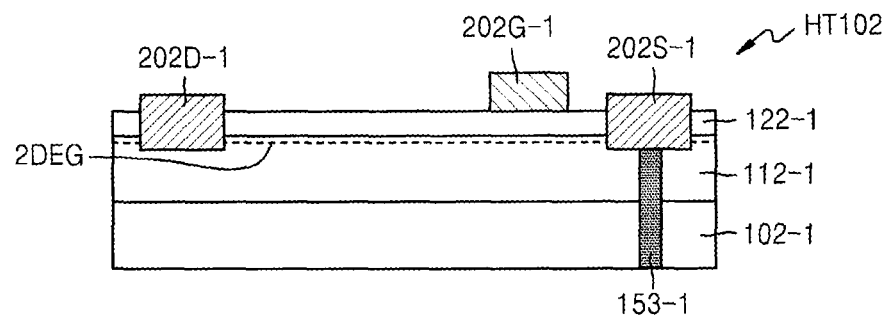
FIGS. 20A through 20E are cross-sectional views illustrating a method of manufacturing a semiconductor device according to example embodiments.

Referring to FIG. 20A, a first channel layer 112-1 and a first channel supply layer 122-1 may be formed on a first substrate 102-1, and a conductive plug 153-1 may be formed through the first channel layer 112-1, the first channel supply layer 122-1 and the first substrate 102-1. Next, a first gate electrode 202G-1, a first source electrode 202S-1, and a first drain electrode 202D-1 may be formed in the first channel supply layer 122-1. According to the operation of FIG. 20A, a first HFET HT102 may be formed on the first substrate 102-1. The first HFET HT102 may have the same structure as or a similar structure to that of the first HFET HT102 of FIG. 19F.

Figure 20B:
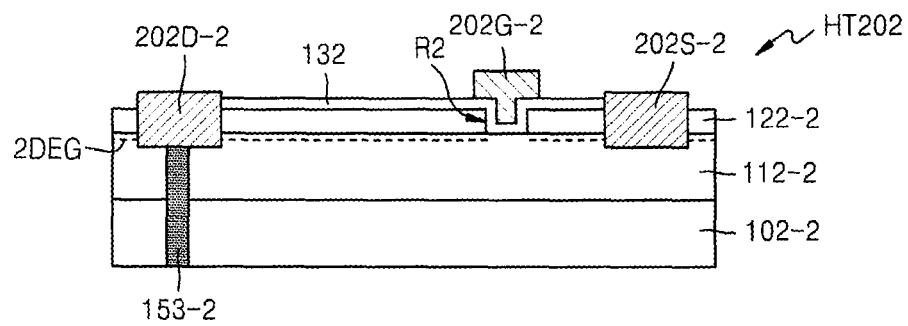

Referring to FIG. 20B, a second channel layer 112-2 and a second channel supply layer 122-2 may be formed on a second substrate 102-2, and a conductive plug 153-2 may be formed through the second channel layer 112-2, the second channel supply layer 122-2 and the second substrate 102-2. A partial region of the second channel supply layer 122-2 may be etched (or recessed) to form a recess region R2, and a gate insulating layer 132 may be formed to cover the recess region R2. A second gate electrode 202G-2 may be formed on the gate insulating layer 132 formed on the recess region R2. A second source electrode 202S-2 and a second drain electrode 202D-2 may be formed in the second channel supply layer 122-2 on both sides of the second gate electrode 202G-2. According to the operation of FIG. 20B, a second HFET HT202 may be formed on the second substrate 102-2. The second HFET HT202 may have the same structure as or a similar structure to that of the second HFET HT202 of FIG. 19F.

Figure 20C:
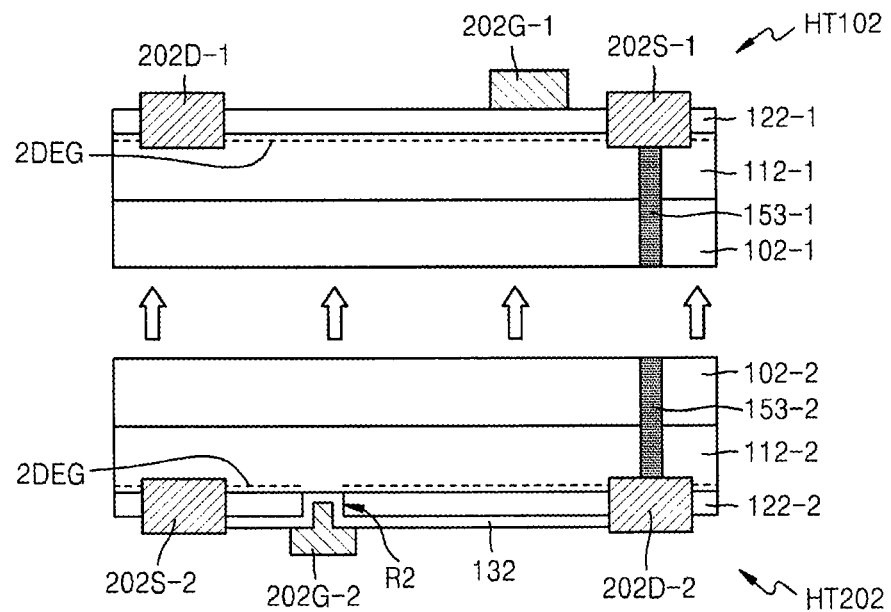
Figure 20D:
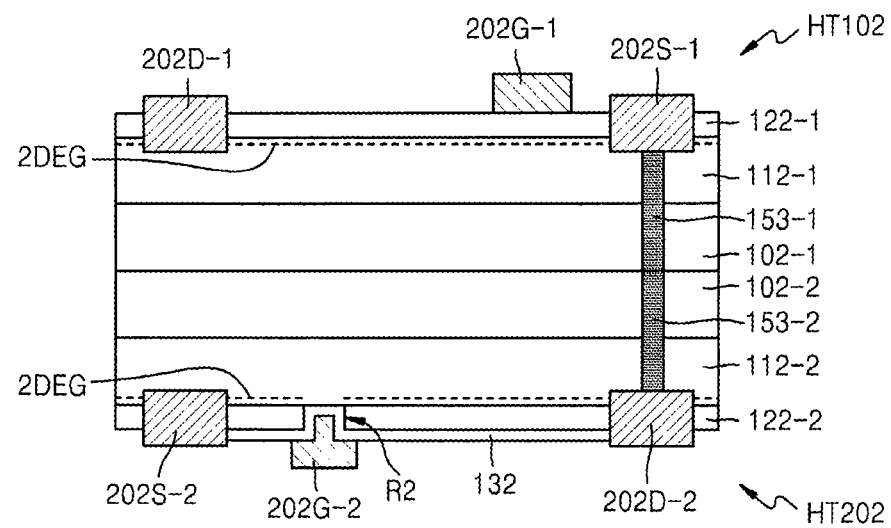

Referring to FIGS. 20C and 20D, the second substrate 102-2 having the second HFET HT202 may be adhered to the first substrate 102-1 having the first HFET HT102. As a result, as shown in FIG. 20D, a semiconductor device including the first and second substrates 102-1 and 102-2 between the first and second HFETs HT102 and HT202 may be formed. The first and second substrates 102-1 and 102-2 may constitute a single 'substrate'. The conductive plug 153-1 of the first HFET HT102 may be connected to the conductive plug 153-2 of the second HFET HT202. The first source electrode 202S-1 and the second drain electrode 202D-2 may be connected by the conductive plugs 153-1 and 153-2 connected to each other.

Figure 20E:
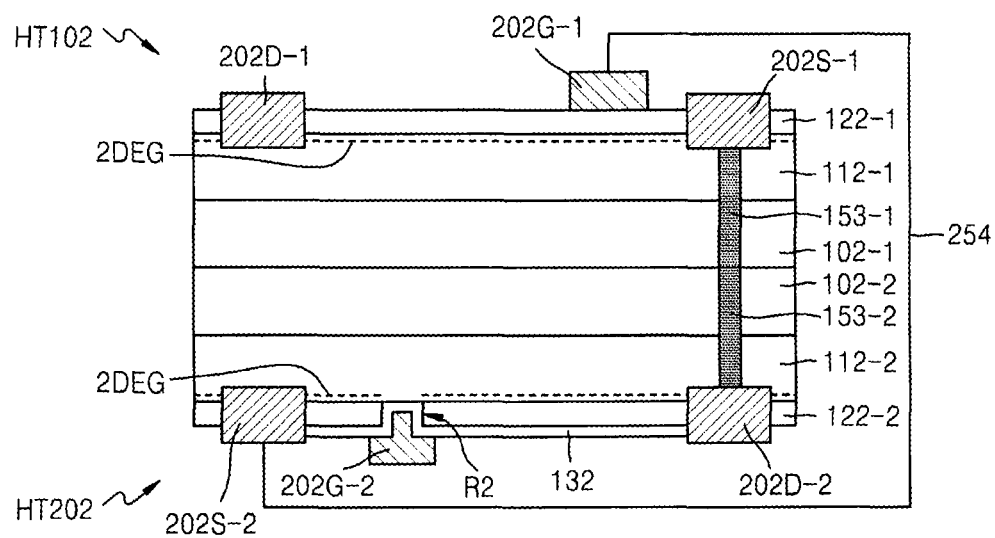

Referring to FIG. 20E, a bonding wire 254 may be formed to connect the first gate electrode 202G-1 and the second source electrode 202S-2. The structure of FIG. 20E may be substantially the same as or similar to that of FIG. 10.

The method described with reference to FIGS. 19A through 19F and the method described with reference to FIGS. 20A through 20E may be variously modified. For instance, the semiconductor devices of FIGS. 11 through 14 and modified structures thereof may be manufactured by modifying the method described with reference to FIGS. 19A through 19F and the method described with reference to FIGS. 20A through 20E. Since the manufacture of the semiconductor devices of FIGS. 11 through 14 and the modified structures thereof would be easily understood by one skilled in the art, a detailed description thereof is omitted.

As described above, according to the one or more of the above embodiments, HFETs may be formed on both surfaces of the same substrate or respectively formed on two substrates and then bonded by using a wafer bonding process for embodying a semiconductor device. In this case, the two HFETs may be connected using a conductive plug formed in the substrate (or substrates) or a bonding wire formed outside the substrate (or substrates). Alternatively, one semiconductor device may use both the conductive plug and the bonding wire. In the present embodiments, devices having various constructions to which HFETs are applied may be easily manufactured, and the devices may be downscaled. Also, unnecessary interconnections may be omitted or the length of interconnections may be reduced.

Although not shown, according to other embodiments, a plurality of first HFETs may be formed on a first surface of a substrate (or single substrate or multi-substrate structure), and a plurality of second HFETs may be formed on a second surface thereof. In this case, at least a portion of the plurality of first HFETs may be electrically connected to at least a portion of the plurality of second HFETs. Semiconductor devices having more complicated, various constructions may be manufactured using the above-described structures.

It should be understood that example embodiments described herein should be considered in a descriptive sense only and not for purposes of limitation. Descriptions of features or aspects within each semiconductor device according to example embodiments should be considered as available for other similar features or aspects in other semiconductor devices according to example embodiments. For example, one skilled in the art knows that the structures of the semiconductor devices shown in FIGS. 1 through 15 may be variously modified. In examples, other materials than a gallium nitride-based material may be used as materials for a channel layer and a channel supply layer, and a connection relationship between first and second HFETs may be modified. Additionally, in some semiconductor devices according to example embodiments, HFETs having the same properties may be formed on both surfaces of a substrate (e.g., a single substrate or multi-substrate structure) and a semiconductor device may be formed using the HFETs. Also, one of ordinary skill in the art understands that the manufacturing methods described with reference to FIGS. 16A through 20E may be variously modified.

Therefore, while some example embodiments have been particularly shown and described, it will be understood by one of ordinary skill in the art that variations in form and detail may be made therein without departing from the spirit and scope of the claims.

What is claimed is:

1. A semiconductor device comprising:
a first heterojunction field effect transistor (HFET) which includes a first channel layer and a first channel supply layer;
a second HFET which includes a second channel layer and a second channel supply layer, and has different properties than the first HFET; and
a substrate having a first surface that is opposite a second surface,
the first channel layer being between the first surface of the substrate and the first channel supply layer; and
the second channel layer being between the second surface of the substrate and the second channel supply layer.

2. The device of claim 1, wherein the first HFET and the second HFET are electrically connected to each other.

3. The device of claim 1, wherein
one of the first and second HFETs includes a 2-dimensional electron gas (2DEG), and
an other thereof includes a 2-dimensional hole gas (2DHG).

4. The device of claim 1, wherein
the first HFET is an n-type HFET, and
the second HFET is a p-type HFET.

5. The device of claim 4, wherein
a gate of the first HFET is connected to a gate of the second HFET, and
a drain of the first HFET is connected to a source of the second HFET.

6. The device of claim 4, wherein
a gate of the first HFET is connected to a gate of the second HFET,
a source of the first HFET is connected to a source of the second HFET, and
a drain of the first HFET is connected to a drain of the second HFET.

7. The device of claim 1, wherein the first HFET and the second HFET are each a high-electron-mobility transistor (HEMT).

8. The device of claim 7, wherein
the first HFET is a normally-on HEMT, and
the second HFET is a normally-off HEMT.

9. The device of claim 8, wherein the first HFET and the second HFET are connected in a cascode configuration.

10. The device of claim 9, wherein a source of the first HFET is connected to a drain of the second HFET.

11. The device of claim 9, wherein a gate of the first HFET is connected to a source of the second HFET.

12. The device of claim 1, wherein at least a portion of the first HFET and at least a portion of the second HFET are connected to each other through the substrate by at least one conductive plug.

13. The device of claim 1, wherein at least a portion of the first HFET and at least a portion of the second HFET are connected to each other by at least one bonding wire.

14. The device of claim 1, wherein
a portion of the first HFET and a portion of the second HFET are connected to each other through the substrate by at least one conductive plug, and
an other portion of the first HFET and an other portion of the second HFET are connected to each other by at least one bonding wire.

15. The device of claim 1, wherein at least one of the first HEFT and the second HFET includes a gallium nitride (GaN)-based material.

16. The device of claim 1, wherein the substrate is one of a single substrate structure and a multi-substrate structure.

17. The device of claim 1, wherein
the substrate includes a first substrate and a second substrate,
the second substrate is adhered to the first substrate,
a bottom surface of the first substrate is on one of the first HFET and the second HFET, and
an other of the first HFET and the second HFET is on a top surface of the second substrate.

18. A power device comprising:
the semiconductor device of claim 1.

19. An inverter comprising:
the semiconductor device of claim 1.

20. A method of manufacturing a semiconductor device, the method comprising:
forming a first HFET on a first surface of a substrate and a second HFET on a second surface of the substrate,
the first HEFT including a first channel layer and a first channel supply layer,
the first channel layer being between the first surface of the substrate and the first channel supply layer,
the second HFET including a second channel layer and a second channel supply layer, the second channel layer being between the second surface of the substrate and the second channel supply layer, the second surface being opposite the first surface of the substrate, and the second HFET having different properties from the first HFET.

21. The method of claim 20, further comprising:

forming a connection element configured to electrically connect the first HFET and the second HFET.

22. The method of claim 21, wherein the forming the connection element comprises:

forming at least one hole through the substrate; and forming a conductive plug in the hole.

23. The method of claim 21, wherein the forming the connection element, comprises:

forming at least one bonding wire for connecting the first and second HFETs.

24. The method of claim 20, wherein one of the first HFET and the second HFET is an n-type HFET, and an other of the first HFET and the second HFET is a p-type HFET.

25. The method of claim 20, wherein one of the first HFET and the second HFET is a normally-on HEMT, and an other of the first HFET and the second HFET is a normally-off HEMT.

* * * * *